US011799225B2

(12) United States Patent
Tziviskos et al.

(10) Patent No.: US 11,799,225 B2
(45) Date of Patent: Oct. 24, 2023

(54) CONNECTOR HAVING CONTACT ARRAY

(71) Applicant: Apple Inc., Cupertino, CA (US)

(72) Inventors: George Tziviskos, San Jose, CA (US);
Aaron N. Miletich, San Jose, CA (US);
Eric S. Jol, San Jose, CA (US)

(73) Assignee: Apple Inc., Cupertino, CA (US)

( * ) Notice: Subject to any disclaimer, the term of this patent is extended or adjusted under 35 U.S.C. 154(b) by 408 days.

(21) Appl. No.: 16/885,122

(22) Filed: May 27, 2020

(65) Prior Publication Data

US 2021/0098915 A1 Apr. 1, 2021

Related U.S. Application Data

(60) Provisional application No. 62/907,063, filed on Sep. 27, 2019.

(51) Int. Cl.
*H01R 12/79* (2011.01)
*H01R 12/77* (2011.01)
*H05K 1/02* (2006.01)

(52) U.S. Cl.
CPC ........... *H01R 12/79* (2013.01); *H01R 12/774* (2013.01); *H05K 1/0281* (2013.01); *H05K 2201/2009* (2013.01)

(58) Field of Classification Search
CPC .... H01R 12/79; H01R 12/774; H01R 12/721; H01R 13/6272
See application file for complete search history.

(56) References Cited

U.S. PATENT DOCUMENTS

| 4,802,860 | A | * | 2/1989 | Kikuta | H01R 12/724 |
| | | | | | 439/82 |
| 5,100,339 | A | * | 3/1992 | Sato | H01R 13/6272 |
| | | | | | 439/354 |
| 5,246,380 | A | * | 9/1993 | Kodama | H01R 13/6272 |
| | | | | | 24/616 |
| 5,755,595 | A | * | 5/1998 | Davis | H01R 13/6582 |
| | | | | | 439/607.01 |
| 5,984,726 | A | * | 11/1999 | Wu | H01R 12/725 |
| | | | | | 439/954 |
| 6,276,964 | B1 | * | 8/2001 | Shinozaki | H01R 31/08 |
| | | | | | 439/912 |
| 6,358,089 | B1 | * | 3/2002 | Kuroda | H01R 13/6594 |
| | | | | | 439/680 |
| 6,361,365 | B1 | * | 3/2002 | Yu | H01R 13/648 |
| | | | | | 439/607.22 |

(Continued)

OTHER PUBLICATIONS

Z-Axis Connector Elements, Product Data Sheet, Z-Axis Connector Company, 2020,. [online], retrieved from the Internet, [retrieved May 29, 2020], <URL: https://www.zaxisconnector.com/applications/flat-flex-cable-connectors/>, 2 pages.

(Continued)

*Primary Examiner* — Neil Abrams
(74) *Attorney, Agent, or Firm* — KILPATRICK TOWNSEND & STOCKTON, LLP

(57) ABSTRACT

Connectors that provide a large number of connections between a flexible circuit board and a printed circuit board, can easily and securely connect the flexible circuit board to the printed circuit board, are readily manufactured, and can be used in an assembly of an electronic device without excessive warpage.

20 Claims, 43 Drawing Sheets

(56) References Cited

U.S. PATENT DOCUMENTS

| | | | | |
|---|---|---|---|---|
| 6,482,027 B2* | 11/2002 | Ishii | ............ | H01R 12/79 |
| | | | | 439/495 |
| 6,851,954 B2* | 2/2005 | Ashman | ............ | H01R 12/716 |
| | | | | 439/70 |
| 7,484,984 B2* | 2/2009 | Liao | ............ | H01R 13/518 |
| | | | | 439/342 |
| 7,604,508 B1* | 10/2009 | Harlan | ............ | H01R 12/716 |
| | | | | 439/630 |
| 7,611,056 B2* | 11/2009 | Sato | ............ | G06K 7/0043 |
| | | | | 235/441 |
| 7,625,217 B1* | 12/2009 | Liao | ............ | H05K 7/1069 |
| | | | | 439/862 |
| 8,292,648 B2* | 10/2012 | Kiryu | ............ | H01R 12/79 |
| | | | | 439/495 |
| 9,033,740 B2 | 5/2015 | Shahoian | | |
| 9,099,819 B2* | 8/2015 | Hwang | ............ | H01R 13/648 |
| 9,400,950 B2* | 7/2016 | Lee | ............ | G06K 7/0021 |
| D907,580 S * | 1/2021 | Asano | ............ | D13/147 |
| 11,217,919 B2* | 1/2022 | Ho | ............ | H01R 43/16 |
| 11,382,231 B2* | 7/2022 | Tsuji | ............ | H05K 7/1069 |
| 11,404,811 B2* | 8/2022 | Do | ............ | H01R 43/20 |
| 2011/0129188 A1* | 6/2011 | Shimotsu | ............ | H01R 12/88 |
| | | | | 385/75 |
| 2012/0104543 A1 | 5/2012 | Shahoian | | |

OTHER PUBLICATIONS

PCBeam™ SPH1 Connectors, On-line Product Data Sheet and Video titled "SPH1 Assembly," Neoconix2019, [online], retrieved on the Internet, [retrieved May 29, 2020], <URL: https://neoconix.com/pcbeam-sph1-connectors/>, 2 pages.

* cited by examiner

CONNECTOR HAVING CONTACT ARRAY

CROSS-REFERENCES TO RELATED APPLICATIONS

This application is a nonprovisional of, claims the benefit of, U.S. provisional application No. 62/907,063, filed Sep. 27, 2019, which is incorporated by reference.

BACKGROUND

Electronic devices are continuously becoming more complicated and are packing an ever increasing amount of functionality. To support this increasing amount of functionality, electronic devices can include a number of various types of boards, such as flexible circuit boards, printed circuit boards, and other types of boards. These boards can require a correspondingly increasing number of interconnect paths between and among them. Accordingly, it can be desirable to provide connectors that provide a large number of connections between two boards, such as a printed circuit board and a flexible circuit board.

During assembly of the electronic device, conventional connectors can be mated to both a flexible circuit board and a printed circuit board. But a complicated assembly procedure can result in component damage and the need to rework or scrap portions of the electronic device. To avoid this damage, it can be desirable that connectors readily connect the flexible circuit board to the printed circuit board. It can also be desirable that these boards can be easily disconnected in the event rework is still necessary.

These electronic devices can be portable and moved during their lifetime. As a result, they can be dropped or otherwise exposed to sudden, physically jarring events. When severe enough, these events can cause inadvertent disconnections between a flexible circuit board and a printed circuit board. It can therefore be desirable that these connectors securely connect the flexible circuit board to the printed circuit board, such that a connection can be maintained during the lifetime of the electronic device, despite the occurrence of such events.

Such electronic devices can be manufactured in large numbers. It can therefore be desirable that these connectors be readily manufactured such that constraints on electronic device assembly are avoided. Also, during electronic device assembly, these connectors can be exposed to heat. It can therefore be desirable that these connectors do not warp during device assembly.

Thus, what is needed are connectors that provide a large number of connections between a flexible circuit board and a printed circuit board, can easily and securely connect the flexible circuit board to the printed circuit board, are readily manufactured, and can be exposed to heat during assembly of an electronic device without excessive warpage.

SUMMARY

Accordingly, embodiments of the present invention can provide connectors that provide a large number of connections between a flexible circuit board and a printed circuit board, can easily and securely connect the flexible circuit board to the printed circuit board, are readily manufactured, and can be exposed to head during assembly of an electronic device without excessive warpage.

An illustrative embodiment of the present invention can provide connectors that provide a large number of connections between a flexible circuit board and a printed circuit board. For example, the connector can include an array of contacts. The contacts in the array of contacts can each include a contacting portion to physically and electrically connect to a contact on the flexible circuit board and a surface-mount contacting portion to be soldered to a corresponding contact on the printed circuit board. Rows in a contact array can be formed by insert or injection molding an array crossbar around portions of a number of contacts. A frame having a number of slats can be insert or injection molded around several array crossbars, where the slats can fit in notches in the array crossbars. Each array crossbar can form a row of contacts and the several array crossbars can form an array. A shell can be placed over the frame, and tabs on the shell can be folded or bent under the shell to form the connector.

These and other embodiments of the present invention can provide a connector that is readily mated to a flexible circuit board and a printed circuit board. Surface-mount contact portions of contacts and shell tabs on a bottom of the connector can be highly planarized to facilitate mating to the printed circuit board. The surface-mount contacting portions can be accurately aligned during molding of array crossbars and frames such that they are highly planarized. Alternatively, the contacts can have surface-mount contacting portions that can be bent to be against a bottom surface of the frame such that they are highly planarized. The shell can include a number of tabs that can be folded under the frame. Recesses can be used to reduce a height that the shell tabs would otherwise contribute, thereby planarizing the shell tabs with the surface-mount contacting portions of the contacts. The height of the connector can be well-controlled since the height is dictated by the position of the shell tabs and a top of the shell. This can provide a connector that can reliably accept a flexible circuit board without damaging it, and can accept the flexible circuit board with a consistent and reliable insertion force.

These and other embodiments of the present invention can provide a connector that securely connects a flexible circuit board to a printed circuit board. The flexible circuit board can include a cowling or stiffener. The stiffener can be fixed to a top surface of the flexible circuit board using an adhesive. The stiffener can include one or more fingers or latches that can be bent above the plane of the stiffener. During insertion, the one or more latches can be pushed flat with the stiffener. The latches can return to their original position when they reach an opening in the shell, thereby locking the stiffener and flexible circuit board to the connector. A shell crossbar can be used to limit a height of the latch in the shell opening. The flexible circuit board can be removed for rework by pushing the latch against the stiffener and extracting the flexible circuit board from the connector.

The structures in these and other embodiments of the present invention can be formed of various materials. For example, the array crossbars and other portions of the frames can be formed of Liquid Crystal Polymer (LCP), such as SumikaSuper™ E6808, manufactured by Sumitomo Chemical Advanced Technologies of Phoenix, Ariz., Laperos® HA475, manufactured by Polyplastics Co. of Tokyo, Japan, or Vectra® S475, manufactured by Celanese Corp. of Irving, Tex. The array crossbars and other portions of frames can be formed of plastic, nylon, or other nonconductive material. The contacts can be formed of copper, copper alloy, stainless steel, or other conductive material. The stiffeners can be formed of copper, copper alloy, stainless steel, or other conductive or nonconductive material. The shells can be formed of copper, copper alloy, stainless steel, or other conductive or nonconductive material. These various structures can be formed using injection molding, stamping, 3-D printing, forging, drawing, or other manufacturing technique.

Embodiments of the present invention can provide connector systems and connectors that can be located in various types of devices, such as portable computing devices, tablet computers, desktop computers, laptops, all-in-one computers, wearable computing devices, cell phones, smart phones, media phones, storage devices, keyboards, covers, charging cases, portable media players, navigation systems, monitors, power supplies, adapters, audio devices and equipment, remote control devices, chargers, and other devices.

These connector systems and connectors can provide pathways for signals and power compliant with various standards such as one of the Universal Serial Bus (USB) standards including USB Type-C, High-Definition Multimedia Interface® (HDMI), Digital Visual Interface (DVI), Ethernet, DisplayPort, Thunderbolt™, Lightning™, Joint Test Action Group (JTAG), test-access-port (TAP), Directed Automated Random Testing (DART), universal asynchronous receiver/transmitters (UARTs), clock signals, power signals, and other types of standard, non-standard, and proprietary interfaces and combinations thereof that have been developed, are being developed, or will be developed in the future. In one example, the connector systems and connectors can be used to convey a data signal, a power supply, and ground. In various embodiments of the present invention, the data signal can be unidirectional or bidirectional and the power supply can be unidirectional or bidirectional. In these and other embodiments of the present invention, the connector systems and connectors can be used to convey power and ground, while data is transmitted wirelessly.

Various embodiments of the present invention can incorporate one or more of these and the other features described herein. A better understanding of the nature and advantages of the present invention can be gained by reference to the following detailed description and the accompanying drawings.

DESCRIPTION OF EXEMPLARY EMBODIMENTS

Figure 1:
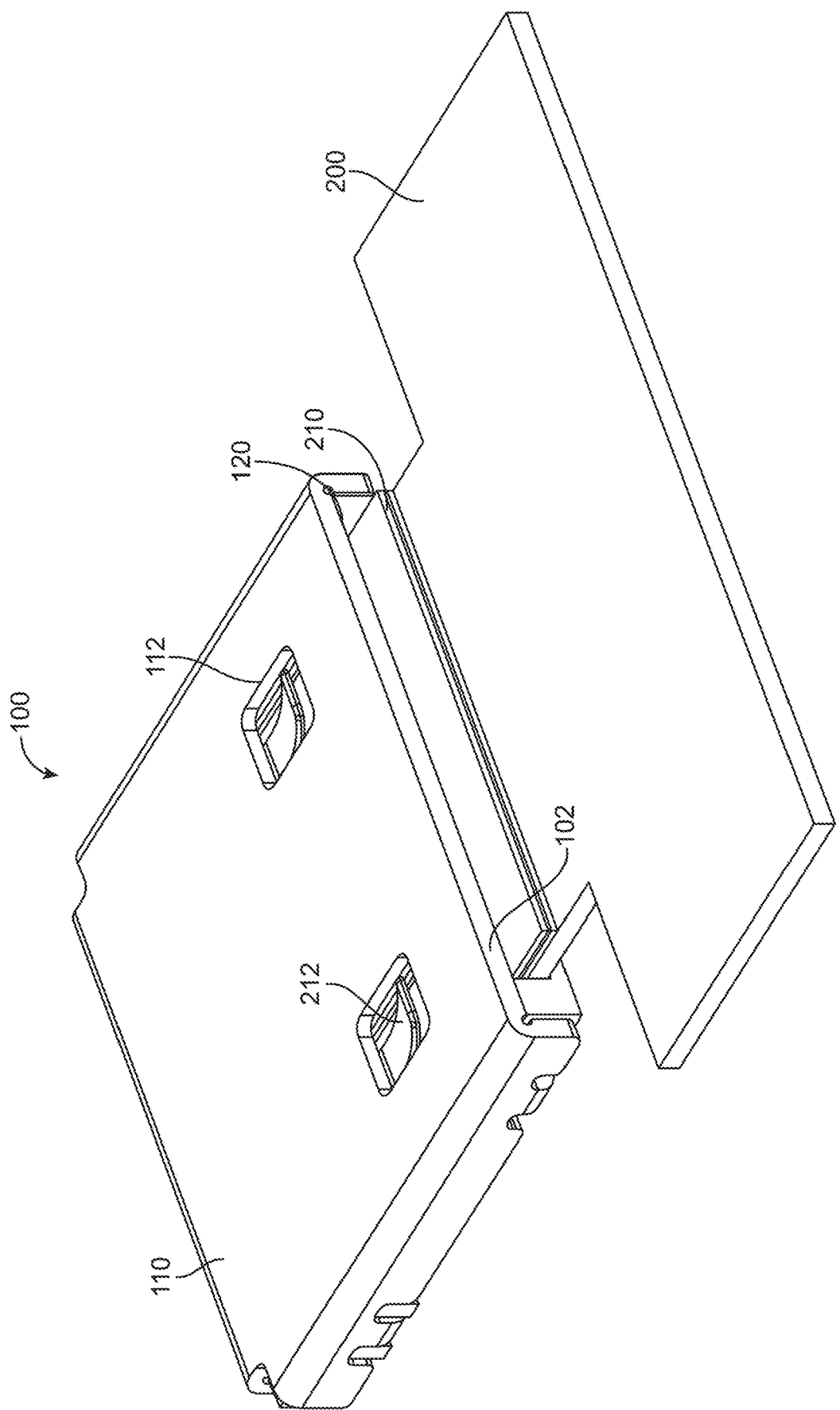
FIG. 1 illustrates a connector system according to an embodiment of the present invention.

FIG. 1 illustrates a connector system according to an embodiment of the present invention. In this example, connector 100 can include shell 110 around frame 120. Opening 102 can accept a portion of flexible circuit board 200. Flexible circuit board 200 can include cowling or stiffener 210. Stiffener 210 can include latches 212 that can fit in openings 112 in shell 110. A front edge of flexible circuit board 200 and stiffener 210 can be inserted into opening 102 of connector 100 and latches 212 can fit in openings 112 in shell 110. This can help to align and secure flexible circuit board 200 in position in connector 100.

Figure 2:
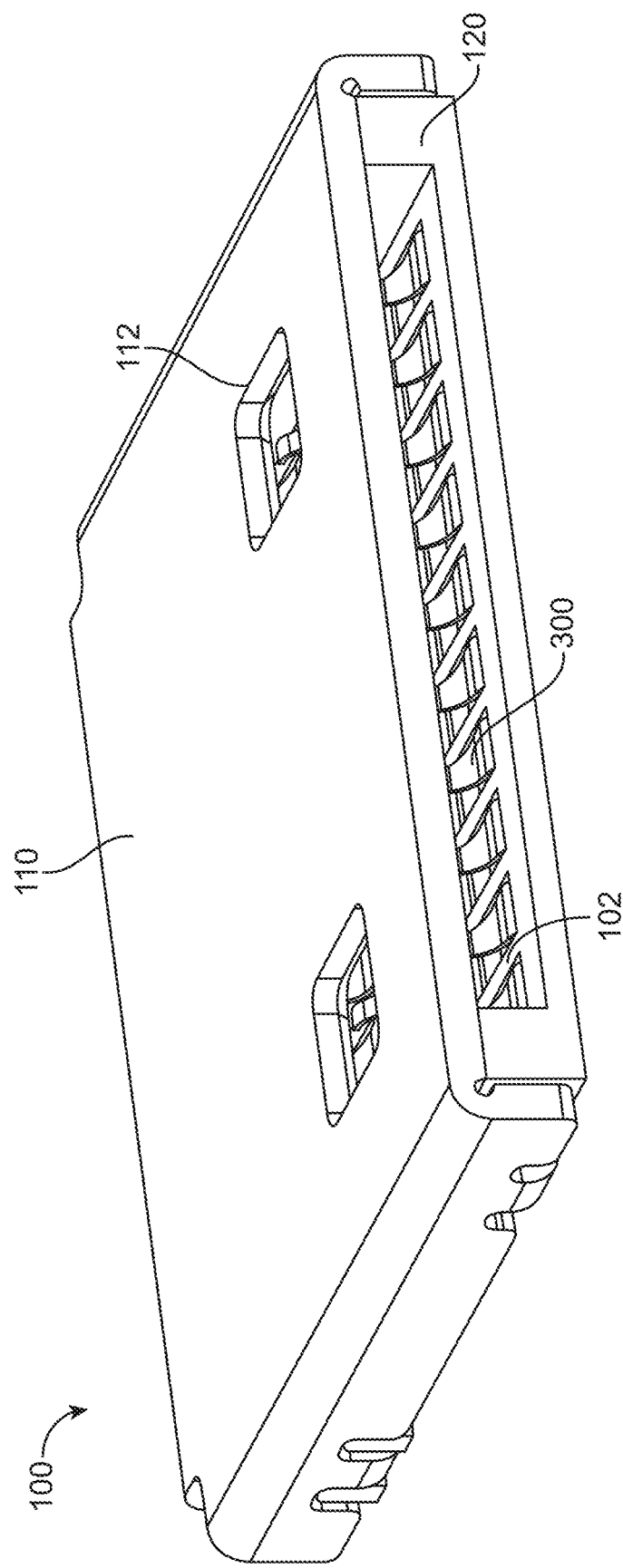
FIG. 2 illustrates a front oblique view of a connector according to an embodiment of the present invention.

FIG. 2 illustrates a front oblique view of a connector according to an embodiment of the present invention. Connector 100 can include frame 120 protected by shell 110. Frame 120 can support an array of contacts 300, which can be accessible to flexible circuit board 200 (shown in FIG. 1) through opening 102. That is, contacts (not shown) on flexible circuit board 200 can physically and electrically connect to contacting portions 302 (shown in FIG. 8) of contacts 300. Shell 110 can include openings 112, which can accept latches 212 on stiffener 210 on flexible circuit board 200 (all shown in FIG. 1.)

Figure 3:
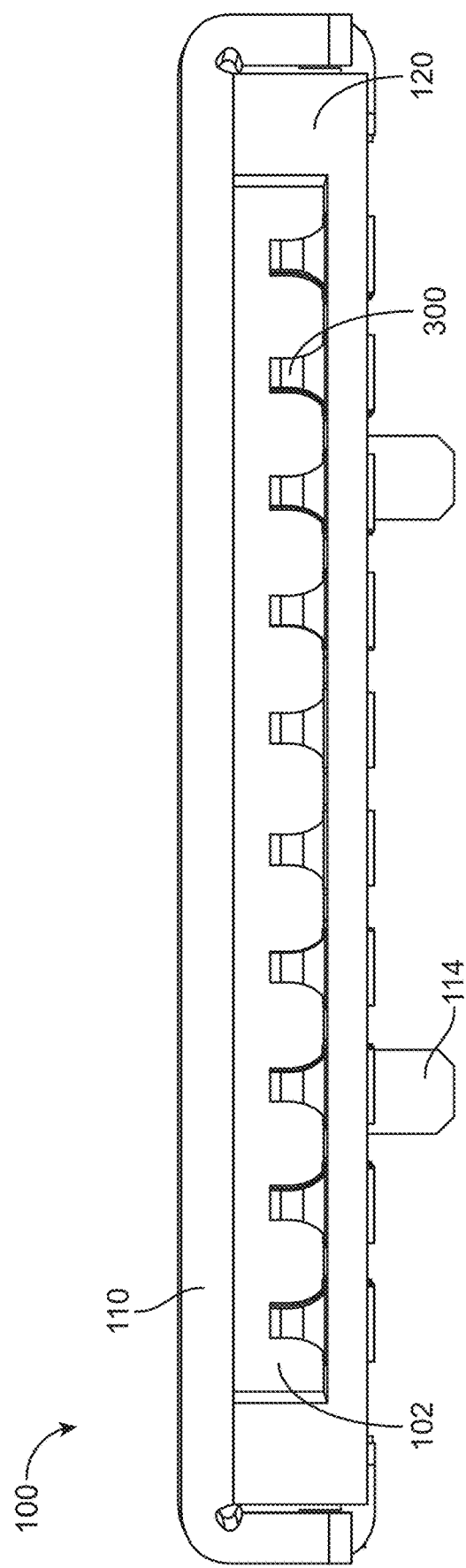
FIG. 3 illustrates a front view of a connector according to an embodiment of the present invention.

FIG. 3 illustrates a front view of a connector according to an embodiment of the present invention. In connector 100, frame 120 can be shielded by shell 110. Shell 110 can include tabs 114. Tabs 114 can be inserted into a corresponding openings (not shown) in printed circuit board 1500 (shown in FIG. 13) or other appropriate substrate. Tabs 114 can be soldered to openings in printed circuit board 1500 to form an electrical connection to ground or other potential. Frame 120 can include opening 102, into which flexible circuit board 200 (shown in FIG. 1) can be inserted to mate with contacts 300 in connector 100.

Figure 4:
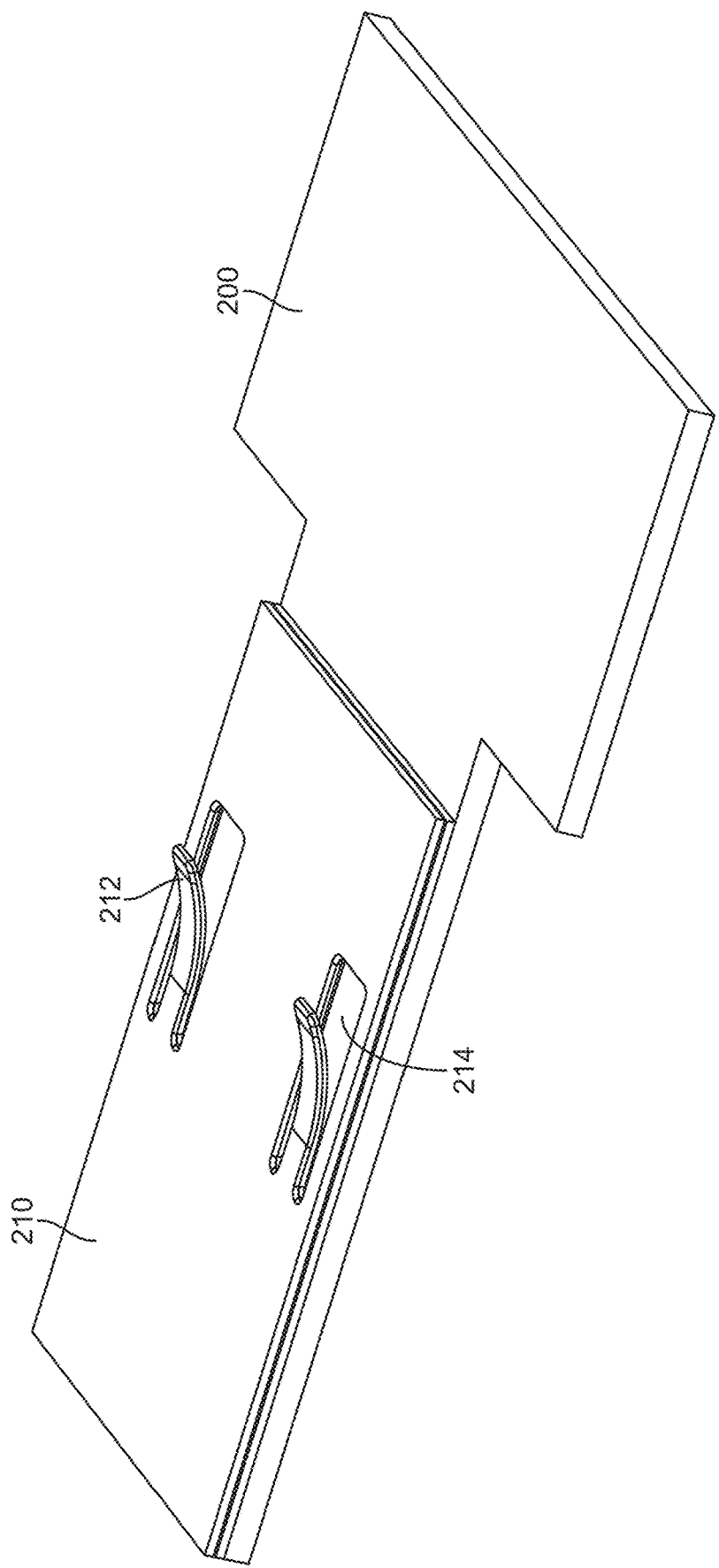
FIG. 4 illustrates a portion of a flexible circuit board according to an embodiment of the present invention.

FIG. 4 illustrates a portion of a flexible circuit board according to an embodiment of the present invention. In this example, stiffener 210 can be attached to flexible circuit board 200. Stiffener 210 can be attached using adhesive or other material (not shown). For example, stiffener 210 can be attached to flexible circuit board 200 using a conductive or nonconductive adhesive, such as a conductive pressure-sensitive adhesive, a conductive temperature-sensitive or heat-activated adhesive, or other adhesive layer. Openings 214 can be formed in stiffener 210 and latches 212 can be formed by lifting or bending.

Figure 5:
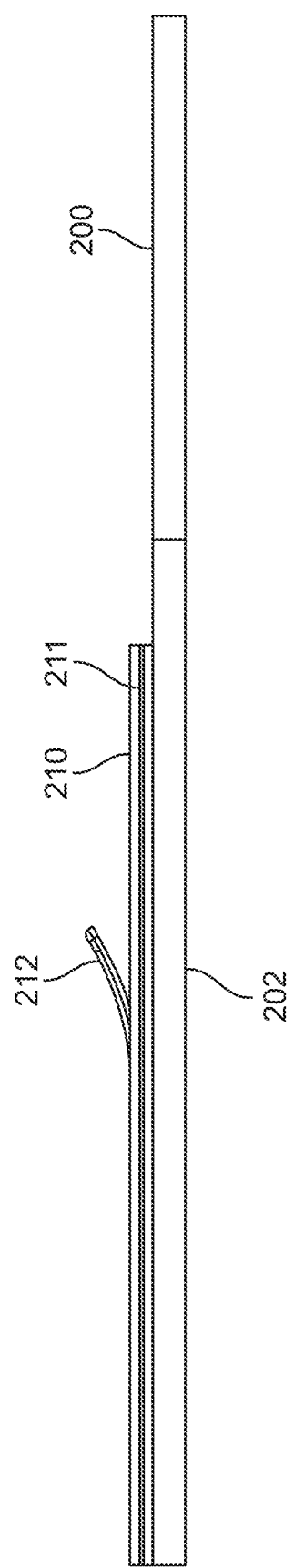
FIG. 5 illustrates a side view of a flexible circuit board according to an embodiment of the present invention.

FIG. 5 illustrates a side view of a flexible circuit board according to an embodiment of the present invention. Stiffener 210 can be attached using a layer 211 of an adhesive to flexible circuit board 200. Latches 212 can be formed in stiffener 210. Contacts (not shown) can be formed on a bottom surface 202 of flexible circuit board 200. Contacts on bottom surface 202 can form electrical connections with contacting portions 302 (shown in FIG. 8) of contacts 300 in connector 100 (shown in FIG. 3.) Contacts on bottom surface 202 can be connected through traces (not shown) in and on flexible circuit board 200 to circuits, contacts, and other electrical components in an electronic device housing connector 100.

Figure 6:
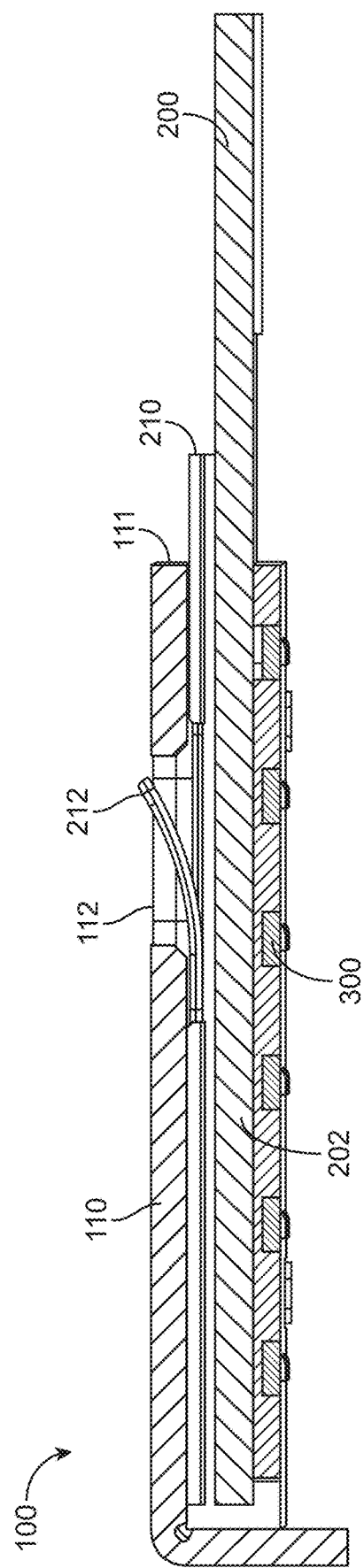
FIG. 6 illustrates a side view of a flexible circuit board mated with a connector according to an embodiment of the present invention.

FIG. 6 illustrates a side view of a flexible circuit board mated with a connector according to an embodiment of the present invention. In this example, flexible circuit board 200 can be mated with connector 100. During insertion of flexible circuit board 200 into connector 100, latch 212 of stiffener 210 can encounter front edge 111 of shell 110 of connector 100. Front edge 111 can push latch 212 downward as shown. When latch 212 reaches opening 112 in shell 110, latch 212 can move upward to its original position. Latch 212 in opening 112 in shell 110 can help to secure flexible circuit board 200 in place in connector 100. Once in place, contacts (not shown) on bottom surface 202 flexible circuit board 200 can form electrical connections with contacts 300 of connector 100. Flexible circuit board 200 can be removed for rework by pushing latch 212 against the stiffener 210 and extracting flexible circuit board 200 from the connector 100. In these and other embodiments of the present invention, stiffener 210 can be formed of multiple layers (not shown.) One or more of these layers can be removed from a top surface of latch 212 to improve the flexibility of latch 212 and to lower the profile of latch 212 in opening 112.

Figure 7:
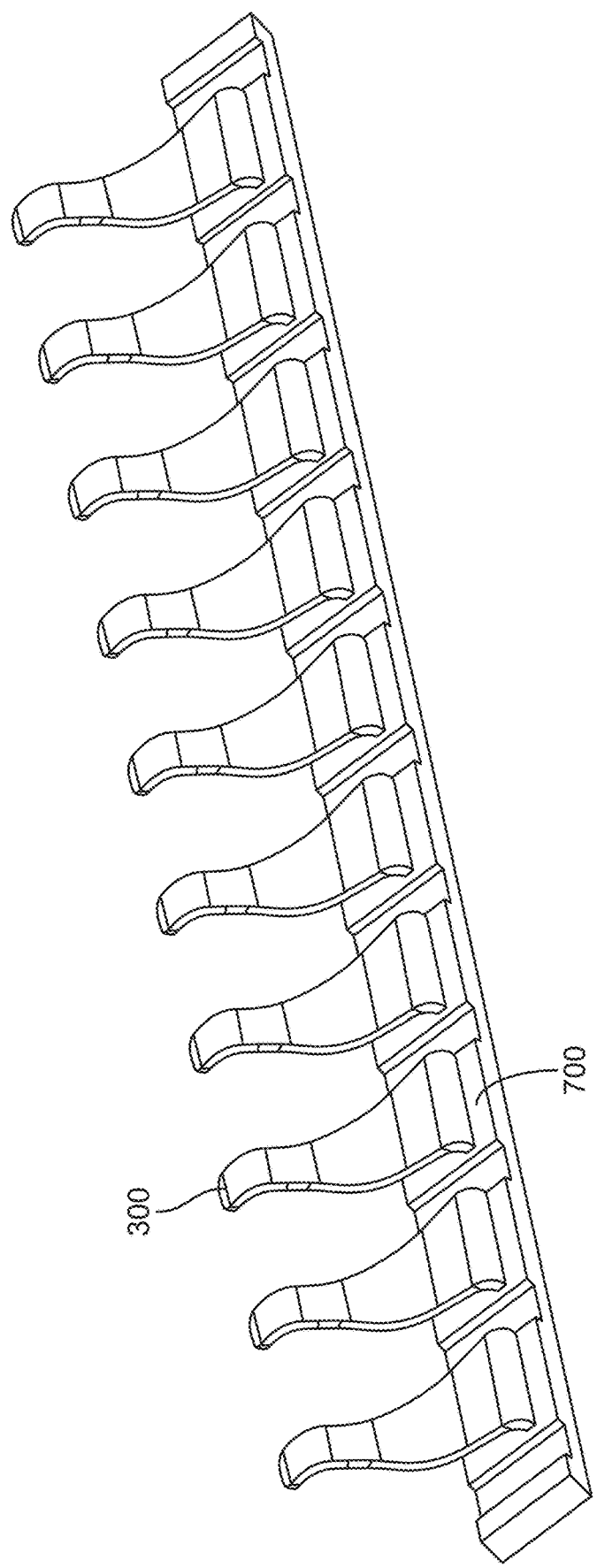
FIGS. 7-10 illustrate a method of manufacturing a connector according to an embodiment of the present invention.
Figure 8:
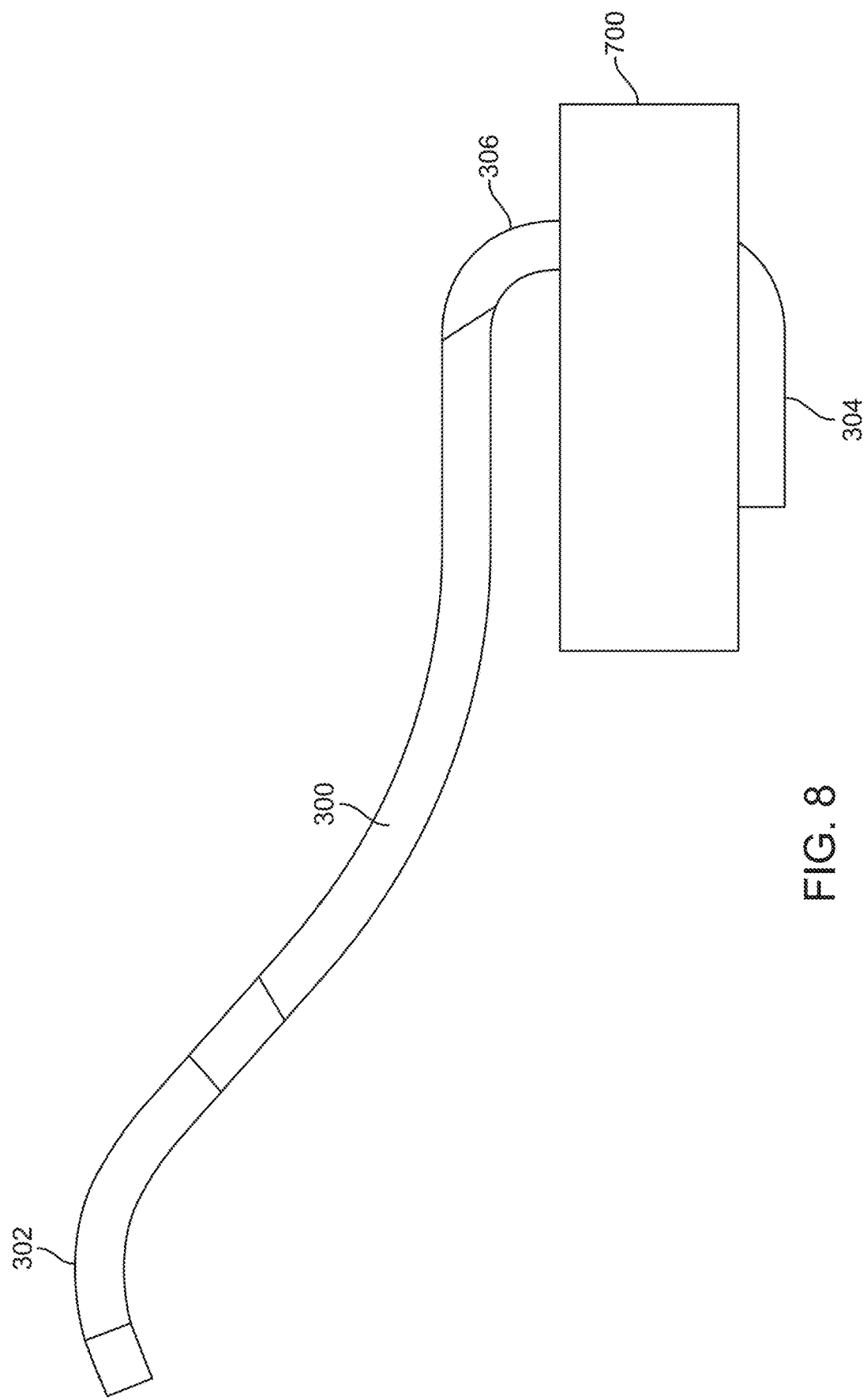
Figure 9:
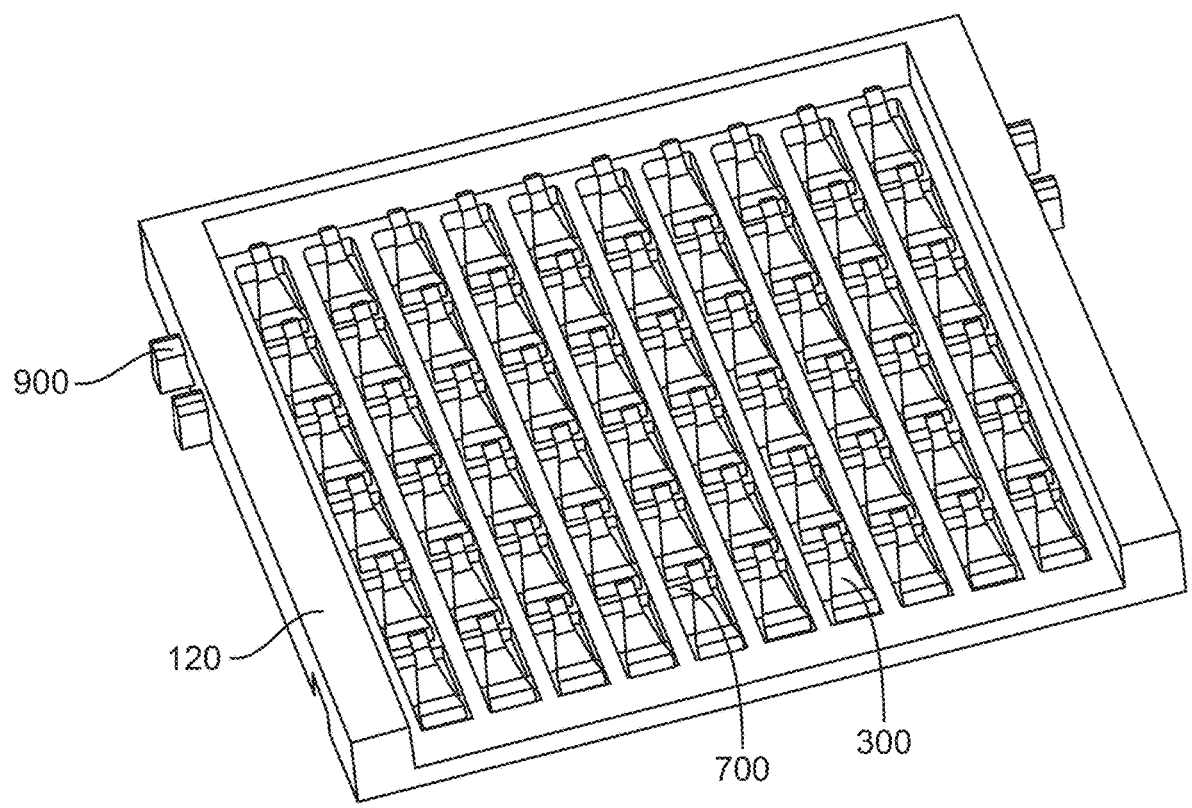
Figure 10:
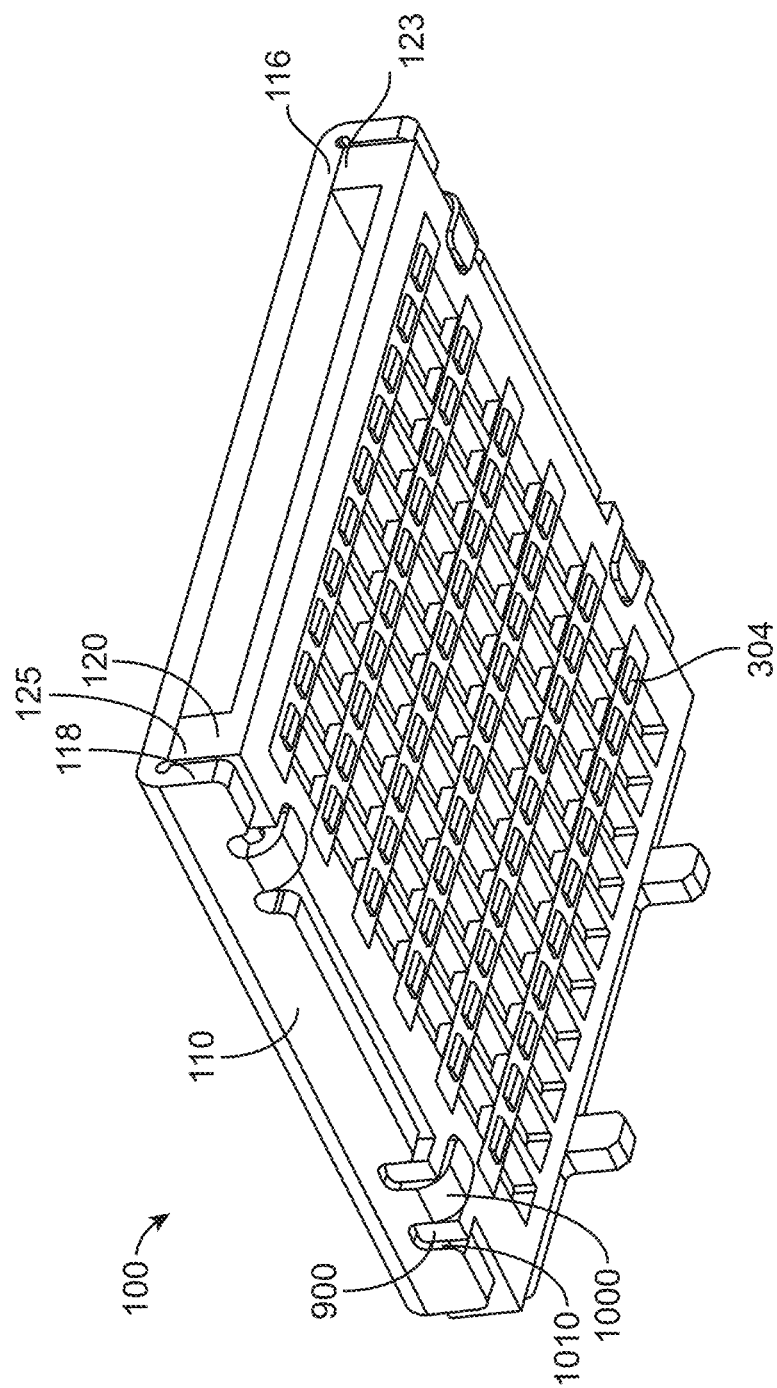

FIGS. 7-10 illustrate a method of manufacturing a connector according to an embodiment of the present invention. In FIG. 7, a number of contacts 300 can be formed. Contacts 300 can be held in place relative to each other by array crossbar 700, which can be formed by insert or injection molding or other manufacturing process around a portion of each contact 300. Array crossbar 700 can include notches 702. In FIG. 8, contacts 300 can be supported by array crossbar 700. Each contact 300 can include a contacting portion 302 for mating with a corresponding contact on a bottom surface 202 of flexible circuit board 200, as shown in FIG. 6. Contacts 300 can also include a surface-mount contacting portions 304 at an opposite end, though contacts 300 can instead have through-hole contacting portions (not shown.) Surface-mount contacting portions 304 can be soldered to a corresponding contact (not shown) on a printed circuit board 1500 (shown in FIG. 13) or other appropriate substrate. Contacts 300 can be supported by array crossbar 700 at a middle portion 306. In FIG. 9, array crossbars 700 can be joined to frame 120 to form an array of contacts 300. Slats 122 of frame 120 can fit in notches 702 (shown in FIG. 7) of array crossbars 700 to form interlocking features to increase a rigidity and reduce warpage of frame 120 during reflow and device assembly. Frame 120 can further include tabs or protrusions 900 for aligning to shell 110, as shown in FIG. 10. In FIG. 10, shell 110 can be assembled to frame 120. Shell 110 can include tab 1000. Tab 1000 can fit between protrusions 900 to be aligned to frame 120. Protrusions 900 can fit in openings 1010 in shell 110. Tab 1000 can be bent around an underside of frame 120. A corresponding recess 1120 (shown in FIG. 11) in frame 120 can be formed to accept tab 1000 such that tab 1000 does not lift connector 100 off printed circuit board 1500 (shown in FIG. 13) or other appropriate substrate. Tabs 1000 can be soldered to a corresponding contact on the printed circuit board. Tabs 1000 and surface-mount contacting portions 304 can be planarized for mating with the printed circuit board.

Figure 13:
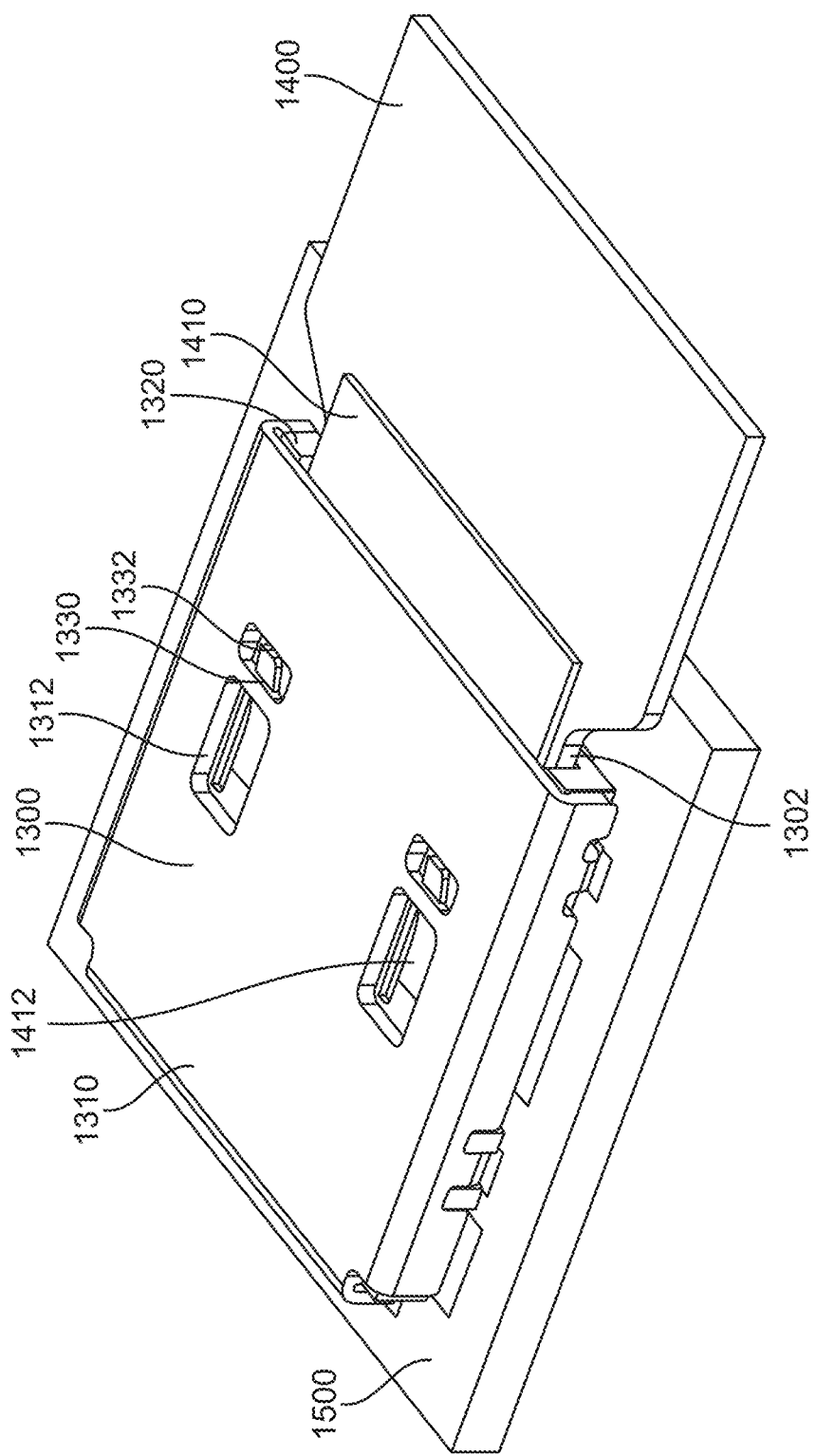
FIG. 13 illustrates another connector system including a connector having a contact array mated with a corresponding flexible circuit board according to an embodiment of the present invention.

Surface-mount contacting portions 304 of contacts 300 (shown in FIG. 8) can be soldered to corresponding contacts on printed circuit board 1500 (shown in FIG. 13.) This soldering can take place during a reflow or other type of manufacturing process. This manufacturing process can cause shell 110 and frame 120 to be heated. During heating, these two structures can expand or otherwise change shape in different ways relative to each other. To compensate for these effects, during assembly, a top 123 of frame 120 can be placed directly against a top 116 of shell 110. This can allow a height of connector 100 to be maintained during the reflow process. Conversely, during assembly, a side 125 of frame 120 can be spaced away from a side 118 of shell 110. The resulting gap can allow for expansion of frame 120 during reflow. These techniques can also be applied to other embodiments of the present invention, such as connector 1300 (shown in FIG. 13), the connector shown in FIG. 34, and the other connectors described herein or otherwise provided by embodiments of the present invention.

A height of connector 100 (shown in FIG. 1), as well as the various versions of connector 1300 shown below, and the other connectors described herein and consistent with embodiments of the present invention, can be well-controlled. For example, the height of connector 100 can be dictated by the position of tabs 1000 and a top of shell 310. This well controlled height can provide a reliable connection between contacts 300 in connector 100 and contacts (not shown) on flexible circuit board 200 (shown in FIG. 1.) This height control can provide a connector 100 that can reliably accept flexible circuit board 200 without damaging flexible circuit board 200 and with a consistent and reliable insertion force.

Figure 11:
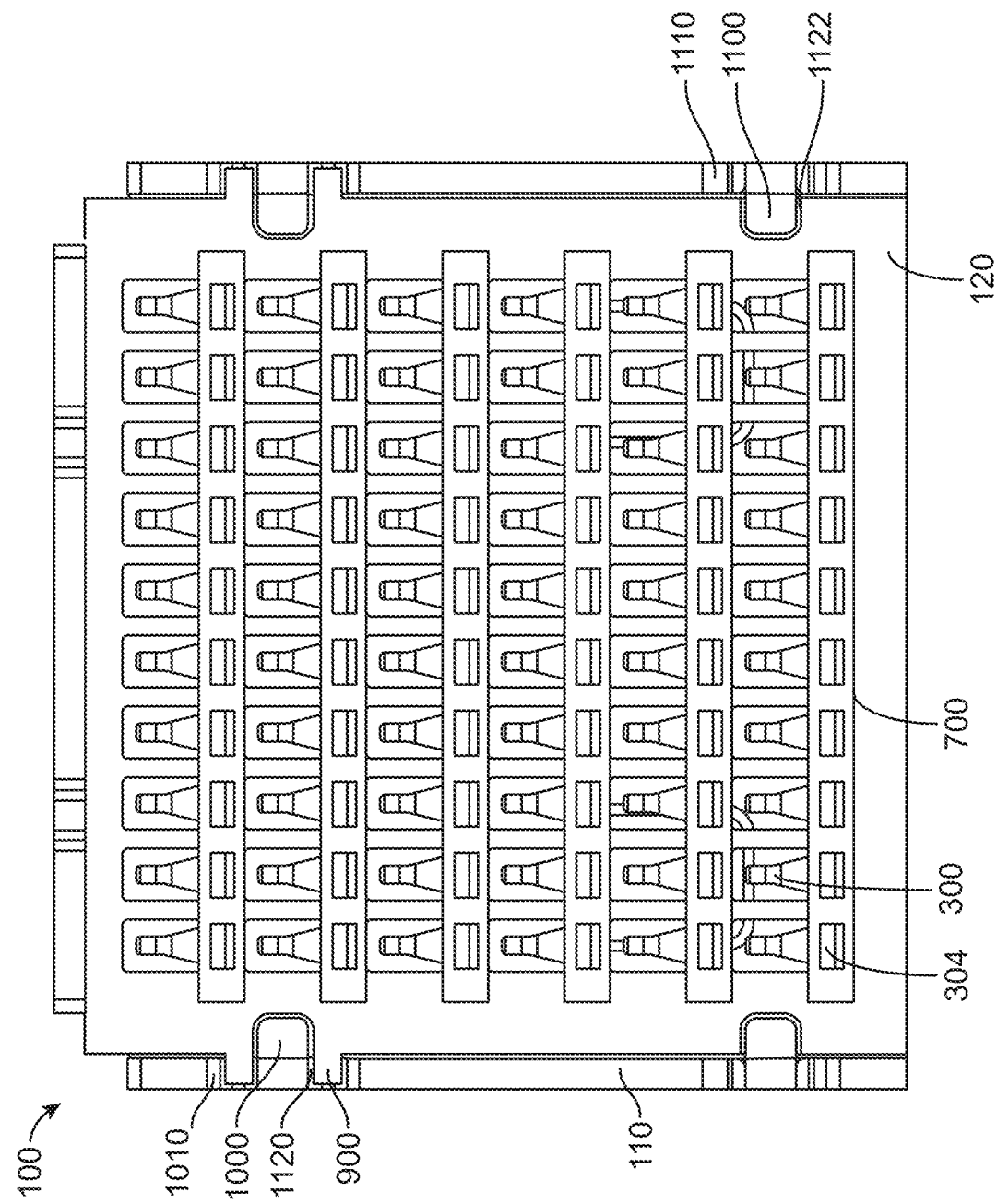
FIG. 11 illustrates an underside of a connector according to an embodiment of the present invention.

FIG. 11 illustrates an underside of a connector according to an embodiment of the present invention. In this example, array crossbars 700 have been joined together by frame 120 to form an array of contacts 300 having surface-mount contacting portions 304 in connector 100. Shell 110 can be fit around frame 120. Frame 120 can include protrusions 900, which can fit in openings 1010 of shell 110. Tabs 1000 can be bent and fit in between protrusions 900. Frame 120 can include recess 1120 for tab 1000. The tolerances between protrusions 900 and openings 1010 can be tight. This can help to keep shell 110 and frame 120 aligned during the reflow process. Tab 1100 can similarly bent to fit in recess 1122 in the bottom side of frame 120. In this example, corresponding protrusions from frame 120 might not be used in openings 1110. This can help to prevent warping of frame 120 during reflow. This arrangement is shown further in the following figure.

Figure 12:
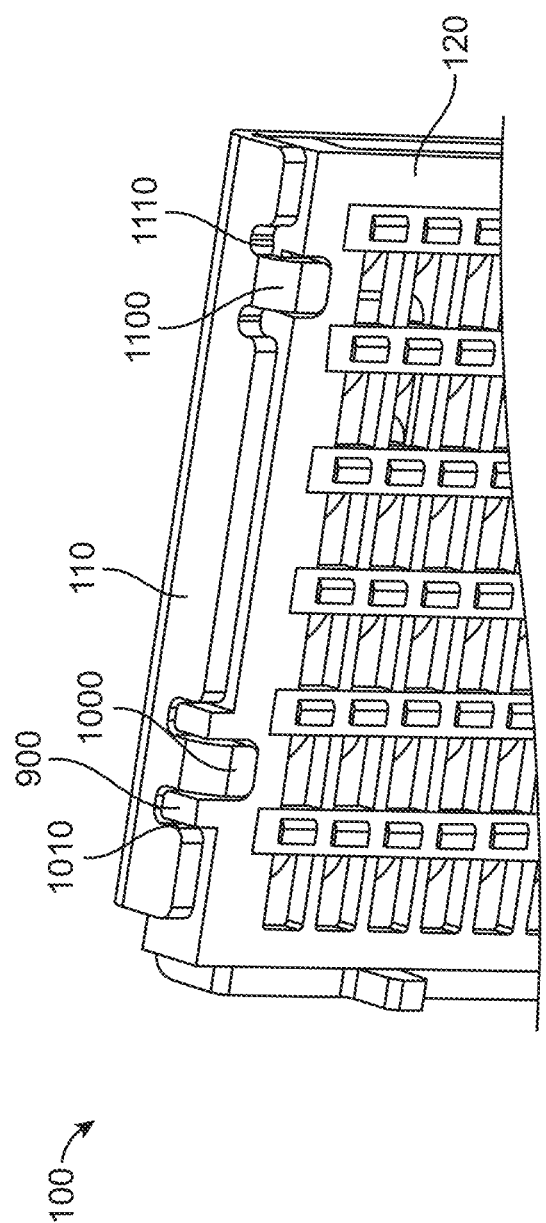
FIG. 12 illustrates a side view of a portion of a connector according to an embodiment of the present invention.

FIG. 12 illustrates a side view of a portion of a connector according to an embodiment of the present invention. Shell 110 of connector 100 can include tabs 1000 and 1100. Protrusions 900 of frame 120 can fit in openings 1010 of shell 110. Again, the tolerances between protrusions 900 and opening 1010 can be tight to control a position frame 120 relative to shell 110 during reflow. Conversely, frame 120 might not include similar protrusions for openings 1110 on each side of tab 1100. This can allow frame 120 to expand relative to shell 110 without causing frame 120 to warp during reflow.

FIG. 13 illustrates another connector system including a connector having a contact array mated with a corresponding flexible circuit board according to an embodiment of the present invention. In this example, connector 1300 can include shell 1310 around frame 1320. Opening 1302 can accept a portion of flexible circuit board 1400. Flexible circuit board 1400 can include cowling or stiffener 1410. Stiffener 1410 can include latches 1412 that can fit in openings 1312 and 1332 in shell 1310. That is, an end of flexible circuit board 1400 and stiffener 1410 can be inserted into opening 1302 in connector 1300, and latches 1412 can fit in openings 1312 and 1332 in shell 1310. This can help to align and secure flexible circuit board 1400 in position in connector 1300. Board 1500 can be a printed circuit board, flexible circuit board, or other appropriate substrate. Traces and pads (not shown) in printed circuit board 1500 can connect to contacts (not shown) on a surface of printed circuit board 1500 as well as components and circuits (not shown) on printed circuit board 1500. These contacts can be soldered to surface-mount contacting portions 1604 (shown in FIG. 21) of contacts 1600 (shown in FIG. 21.) Contacting portions 1602 (shown in FIG. 21) of contacts 1600 can physically and electrically connect to contacts 1404 (shown in FIG. 15) on a bottom side of flexible circuit board 1400. Contacts 1404 on the bottom side of flexible circuit board 1400 can connect to other circuits and components (not shown) via traces (not shown) of flexible circuit board 1400.

As compared to connector 100, connector 1300 is shown as having two openings 1312 and 1332 for each latch 1412 on stiffener 1410. These openings 1312 and 1332 can be separated by shell crossbar 1330. Shell crossbar 1330 can control a vertical height of latch 1412 in openings 1312 and 1332. For example, shell crossbar 1330 can prevent latch 1412 from extending above a top surface of shell 1310. This is shown further in FIG. 18 below.

Figure 14:
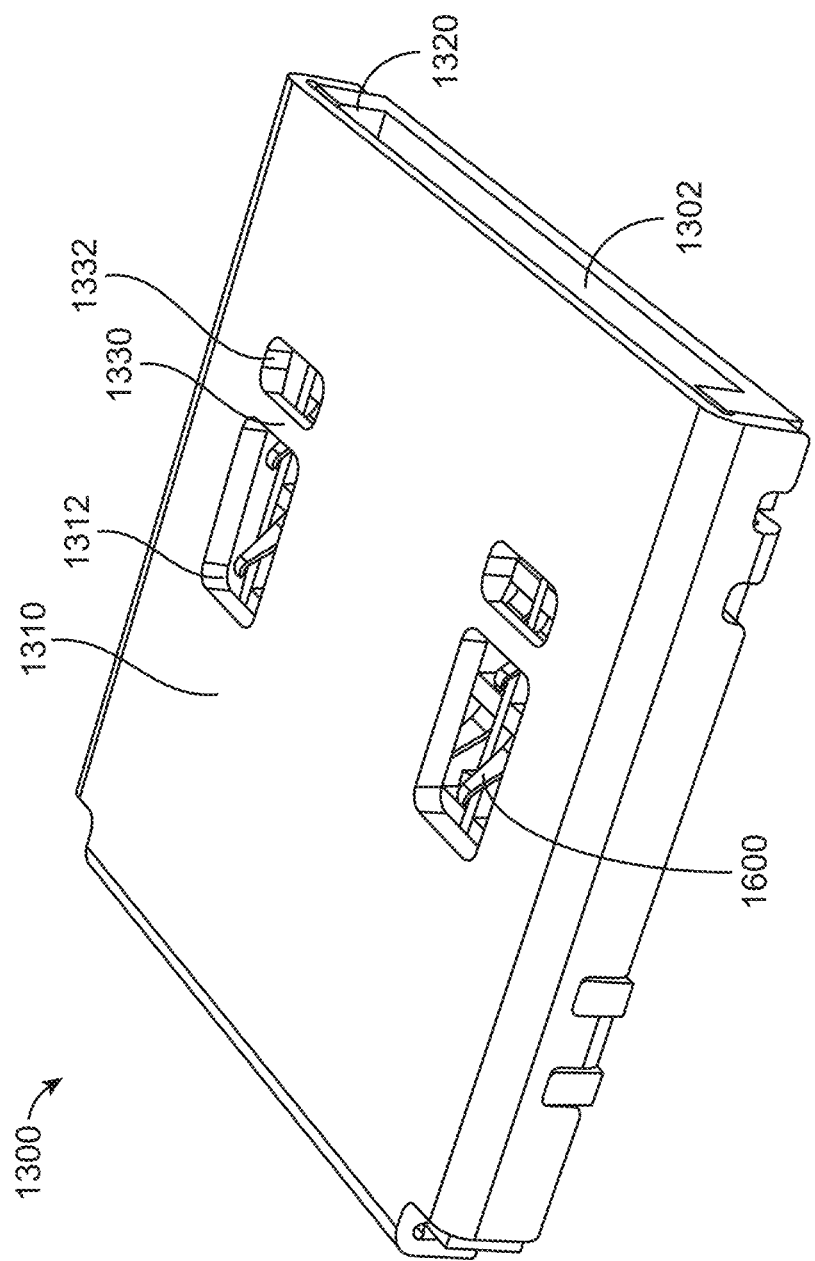
FIG. 14 illustrates a front oblique view of a connector according to an embodiment of the present invention.

FIG. 14 illustrates a front oblique view of a connector according to an embodiment of the present invention. Connector 1300 can include frame 1320 protected by shell 1310. Frame 1320 can support an array of contacts 1600, which can be physically and electrically connected to contacts 1404 (shown in FIG. 15) on a bottom side of flexible circuit board 1400 (shown in FIG. 13) when flexible circuit board 1400 is inserted in opening 1302. Shell 1310 can include openings 1312 and 1332, which can be separated by shell crossbar 1330, and which can accept latches 1412 on stiffener 1410 on flexible circuit board 1400 (all shown in FIG. 13.)

Figure 15:
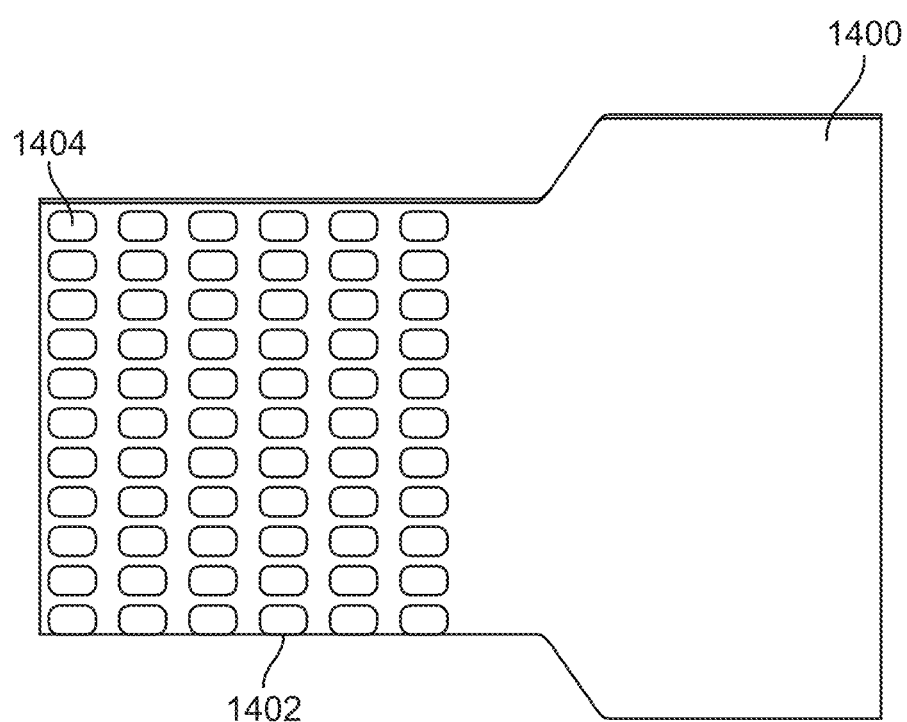
FIG. 15 illustrates a portion of a flexible circuit board according to an embodiment of the present invention.

FIG. 15 illustrates a portion of a flexible circuit board according to an embodiment of the present invention. Contacts 1404 can be located on an end or tab portion 1402 of flexible circuit board 1400. Contacts 1404 can be connected to traces (not shown) in flexible circuit board 1400. Contacts 1404 can be connected through these traces to circuits, contacts, and other electrical components in an electronic device housing connector 1300.

Figure 16:
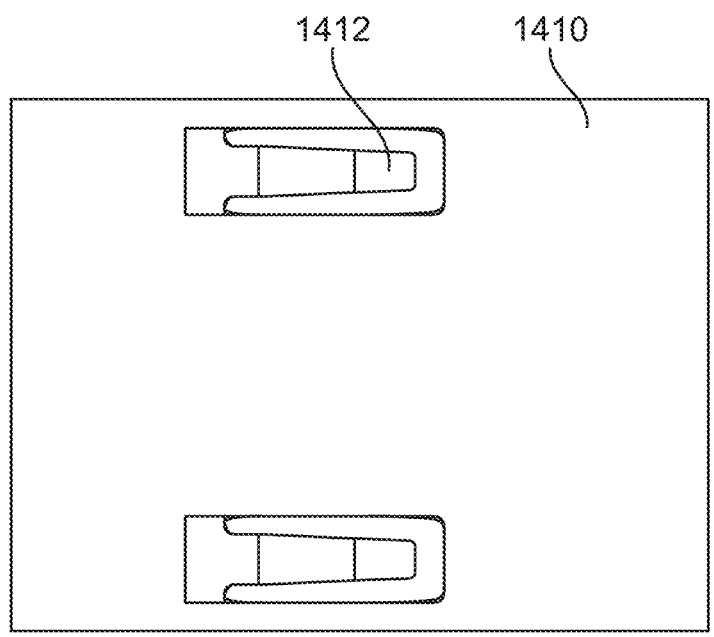
FIG. 16 illustrates a stiffener for a portion of a flexible circuit board according to an embodiment of the present invention.

FIG. 16 illustrates a stiffener for a portion of a flexible circuit board according to an embodiment of the present invention. Stiffener 1410 can include latches 1412. Latches 1412 can be stamped or otherwise formed from stiffener 1410, or latches 1412 can be attached to stiffener 1410.

Figure 17:
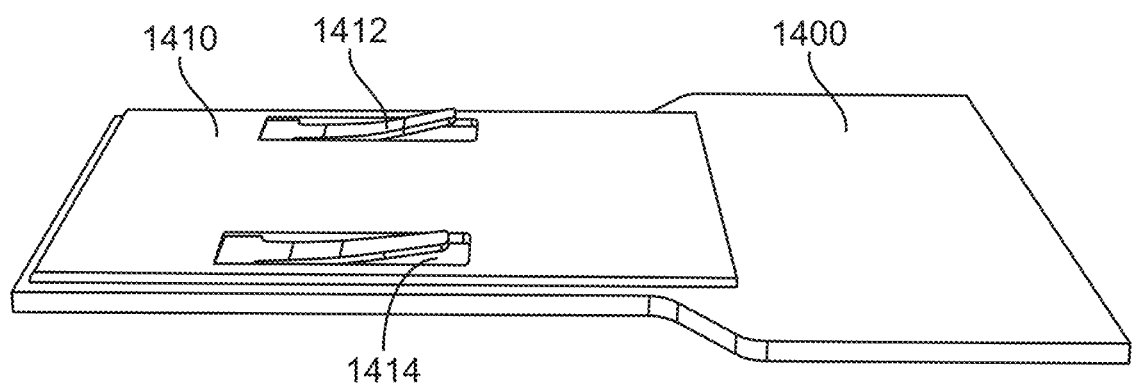
FIG. 17 illustrates a portion of a flexible circuit board and stiffener according to an embodiment of the present invention.

FIG. 17 illustrates a portion of a flexible circuit board and stiffener according to an embodiment of the present invention. In this example, stiffener 1410 can be attached to flexible circuit board 1400. Stiffener 1410 can be attached using adhesive or other material (not shown.) For example, stiffener 1410 can be attached to flexible circuit board 1400 using a conductive or nonconductive adhesive, such as a conductive pressure-sensitive adhesive, a conductive temperature-sensitive or heat-activated adhesive, or other adhesive layer. Openings 1414 can be formed in stiffener 1410 and latches 1412 can be formed by lifting or bending.

Figure 18:
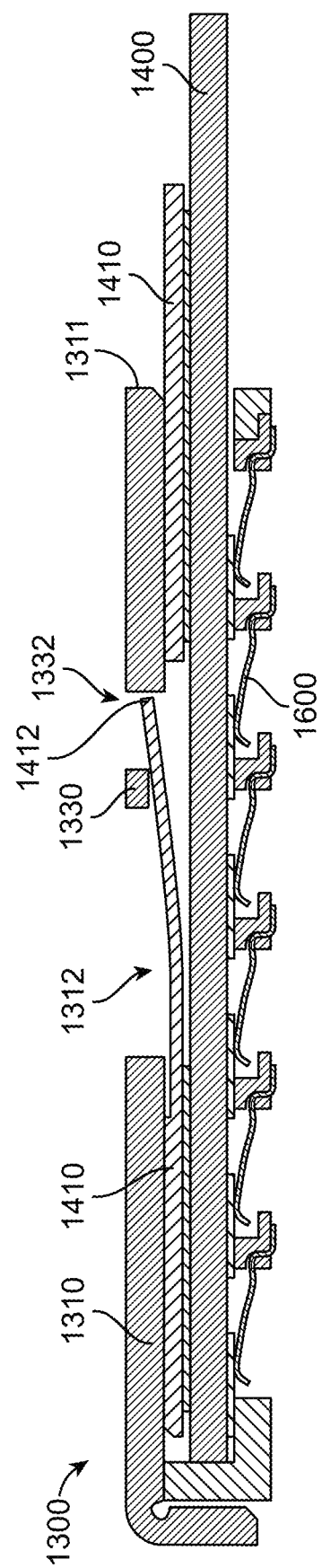
FIG. 18 illustrates a side view of a flexible circuit board mated with a connector according to an embodiment of the present invention.

FIG. 18 illustrates a side view of a flexible circuit board mated with a connector according to an embodiment of the present invention. In this example, flexible circuit board 1400 can be mated with connector 1300, that is, flexible circuit board 1400 can be inserted into connector 1300. During insertion of flexible circuit board 1400 into connector 1300, latch 1412 of stiffener 1410 can encounter front edge 1311 of shell 1310 of connector 1300. Front edge 1311 can push latch 1412 downward as shown. When latch 1412 reaches openings 1312 and 1332 in shell 1310, latch 1412 can move upward to its original position. This upward travel can be limited by shell crossbar 1330. Latch 1412 in openings 1312 and 1332 in shell 1310 can help to secure flexible circuit board 1400 in place in connector 1300. Once in place, contacts 1404 on flexible circuit board 1400 (shown in FIG. 15) can form electrical connections with contacting portions 1602 (shown in FIG. 19) of contacts 1600 of connector 1300. Flexible circuit board 1400 can be removed for rework by pushing latch 1412 against the stiffener 1410 and extracting flexible circuit board 1400 from the connector 1300.

Figure 19:
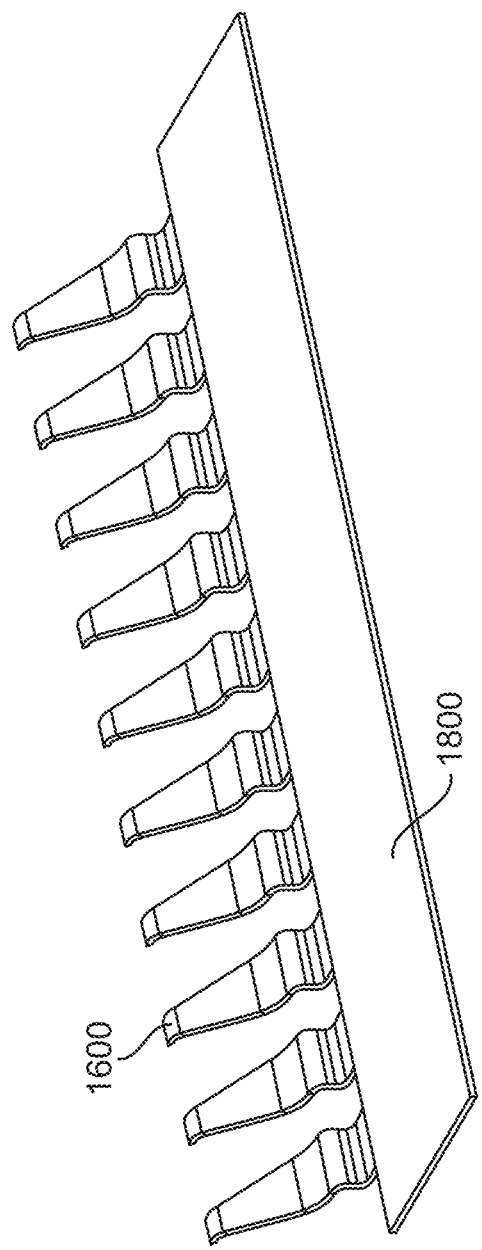
FIGS. 19-23 illustrate a method of manufacturing a connector according to an embodiment of the present invention.
Figure 20:
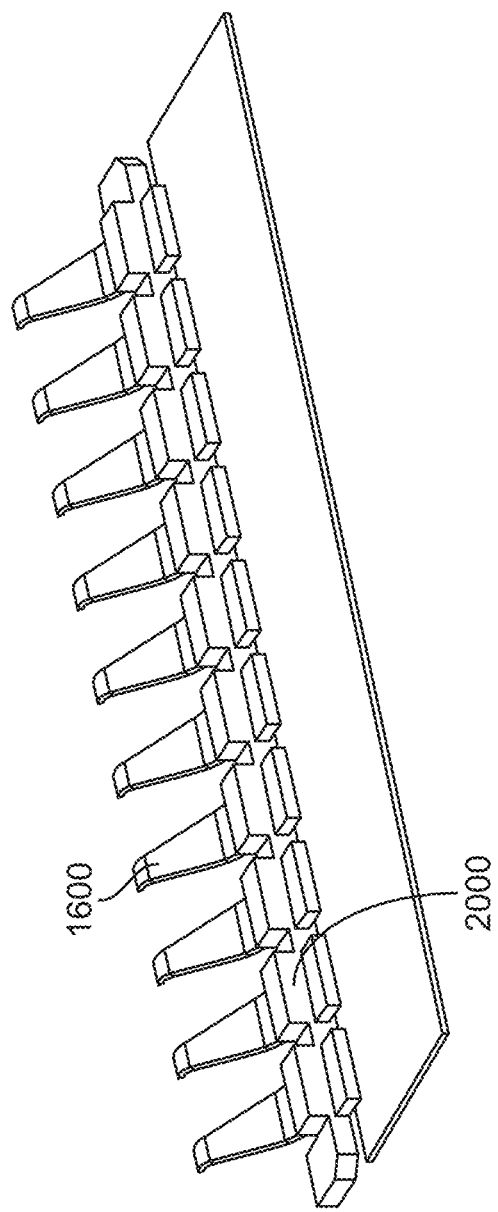
Figure 21:
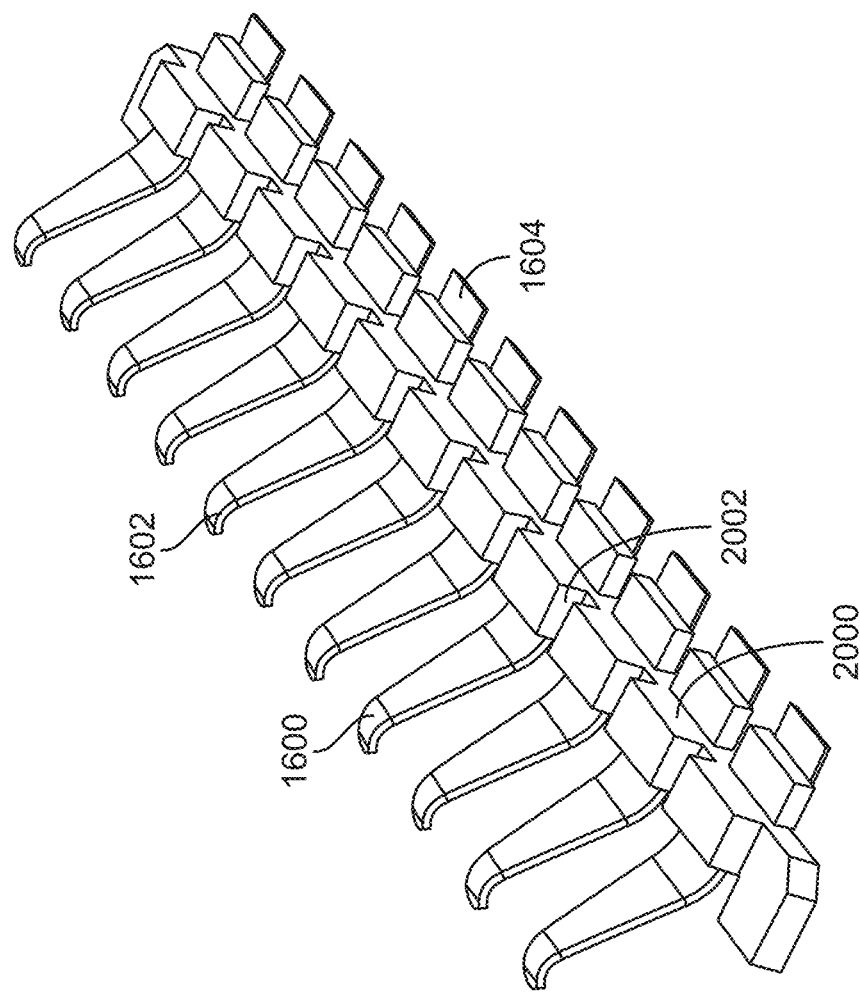
Figure 22:
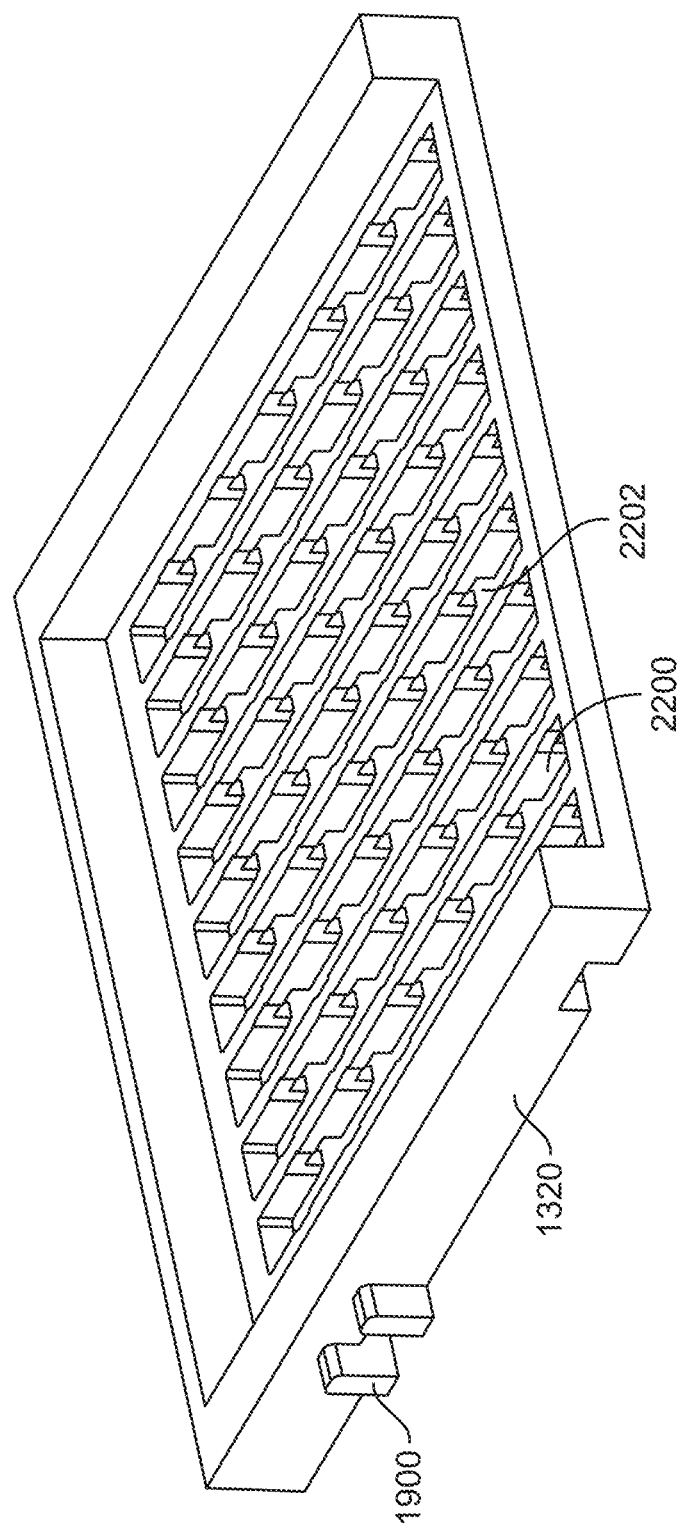
Figure 23:
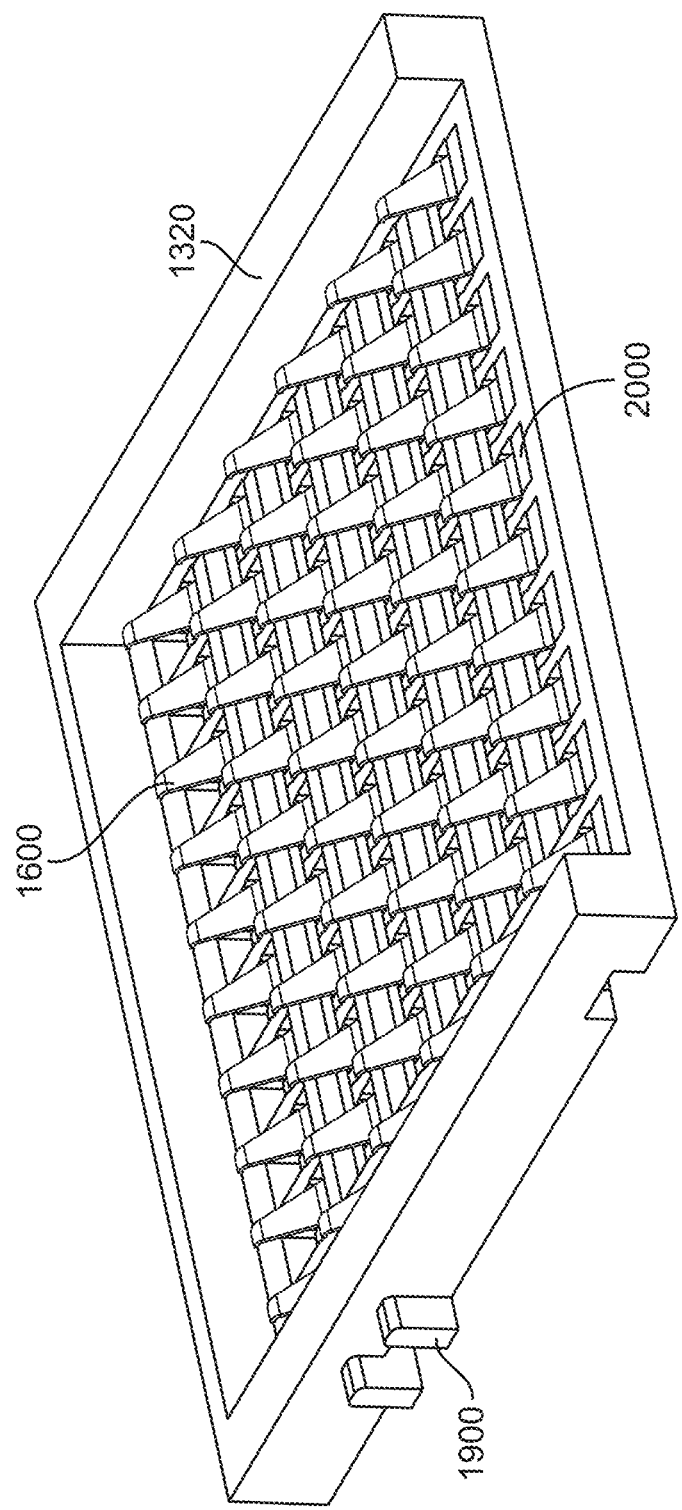

FIGS. 19-23 illustrate another method of manufacturing a connector according to an embodiment of the present invention. In FIG. 19, a number of contacts 1600 can be formed. A sheet of metal can be stamped to form contacts 1600 and carrier 1800. Contacts 1600 can be held in place relative to each other for further manufacturing steps by carrier 1800. In FIG. 20, contacts 1600 can be supported by array crossbar 2000, which can be formed by insert or injection molding or other manufacturing process around a portion of each contact 1600. In FIG. 21, contacts 1600 can be separated from carrier 1800, and carrier 1800 can be recycled. Each contact 1600 can include a contacting portions 1602 for mating with a corresponding contact 1404 on a bottom surface of flexible circuit board 1400, as shown in FIG. 15. Contacts 1600 can also include a surface-mount contacting portions 1604 at an opposite end, though contacts 1600 can instead have through-hole contacting portions (not shown.) Surface-mount contacting portions 1604 can be soldered to a corresponding contact (not shown) on printed circuit board 1500 (shown in FIG. 13) or other appropriate substrate. Contacts 1600 can be supported by array crossbar 2000. Array crossbar 2000 can have notches 2002. In FIG. 22, frame 1320 can be formed. Frame 1320 can further include protrusions 1900 for aligning to shell 1310, as shown with respect to connector 100 in FIG. 10. Frame 1320 can include slats 2200 having notches 2202. In FIG. 23, contacts 1600 and array crossbars 2000 can be fit to slats 2200 in frame 1320. Again, Frame 1320 can further include protrusions 1900 for aligning to shell 1310. In these and other embodiments of the present invention, frame 1320 can be insert or injection molded around array crossbars 2000.

Figure 24:
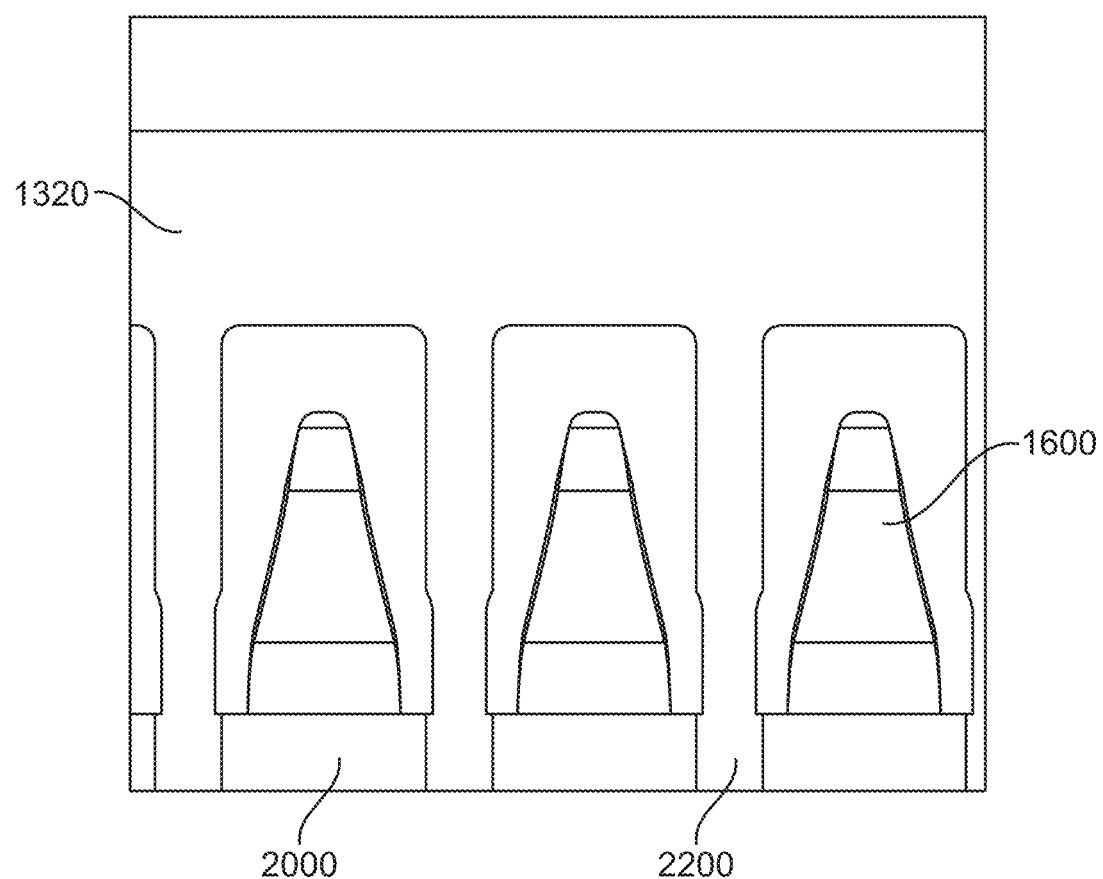
FIG. 24 is a detail view of a portion of a frame and contacts for a connector according to an embodiment of the present invention.

FIG. 24 is a detail view of a portion of a frame and contacts for a connector according to an embodiment of the present invention. Contacts 1600 can be held in place in frame 1320 by array crossbar 2000. Notches 2002 (shown in FIG. 21) in array crossbar 2000 can accept slats 2200. Notches 2202 (shown in FIG. 22) in slats 2200 can accept array crossbar 2000. These interlocking features can help to secure connector 1300 (shown in FIG. 13) as a single piece.

Figure 25:
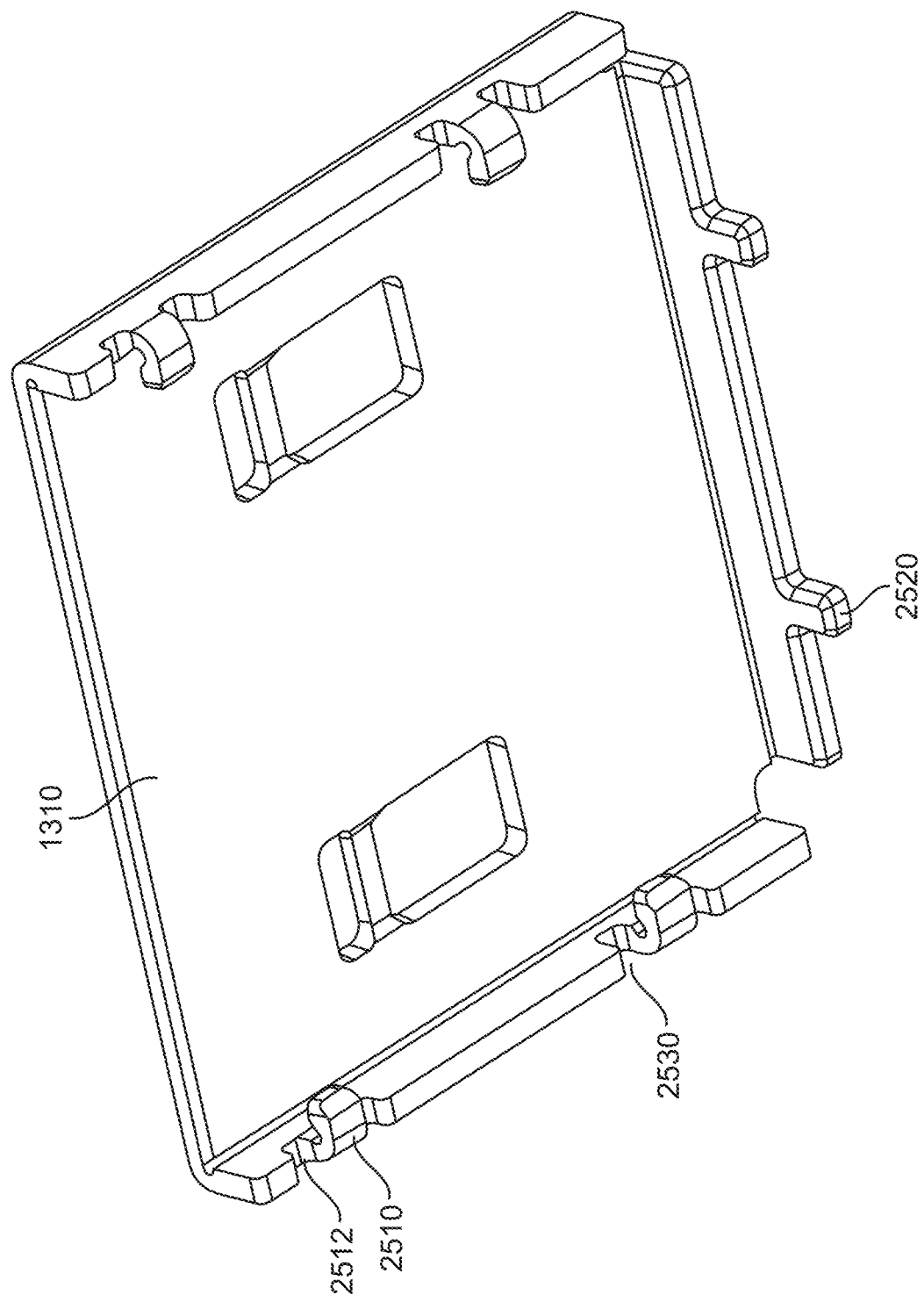
FIG. 25 illustrates a shell for a connector according to an embodiment of the present invention.

FIG. 25 illustrates a shell for a connector according to an embodiment of the present invention. Shell 1310 can be fit over the frame 1320 of FIG. 23. Shell 1310 can include tab 2510. Tab 2510 can fit between protrusions 1900 (shown in FIG. 23) to be aligned to frame 1320. Protrusions 1900 can fit in openings 2512 in shell 1310. Tab 2510 can be bent around an underside of frame 1320. A corresponding recess 1120 (shown in FIG. 11 for connector 100 shown in FIG. 1) in frame 1320 can be formed to accept tab 2510 such that tab 2510 does not lift connector 1300 off a printed circuit board 1500 (shown in FIG. 13) or other appropriate substrate. Tabs 2510 can be soldered to a corresponding contact on the printed circuit board. Tabs 2510 can be planarized for mating with printed circuit board 1500. Tabs 2520 can be inserted into openings (not shown) and soldered in place in printed circuit board 1500.

A height of connector 1300 (and 100, shown in FIG. 1) can be well-controlled. For example, the height of connector 1300 (shown in FIG. 13) can be dictated by the position of tabs 2510 and a top of shell 1310. This well controlled height can provide a reliable connection between contacts 1600 (shown in FIG. 13) in connector 1300 and contacts 1404 on flexible circuit board 1400 (shown in FIG. 15.) This height control can provide a connector 1300 that can reliably accept flexible circuit board 1400 (shown in FIG. 13) without damaging flexible circuit board 1400 and with a consistent and reliable insertion force.

The tolerances between protrusions 1900 (shown in FIG. 23) and openings 2512 can be tight. This can help to keep shell 1310 and frame 1320 aligned during a reflow process. In this example, corresponding protrusions from frame 1320 might not be used in openings 2530. This can help to prevent warping of frame 1320 during reflow. That is, this can allow frame 1320 to expand relative to shell 1310 without causing frame 1320 to warp during reflow.

Figure 26:
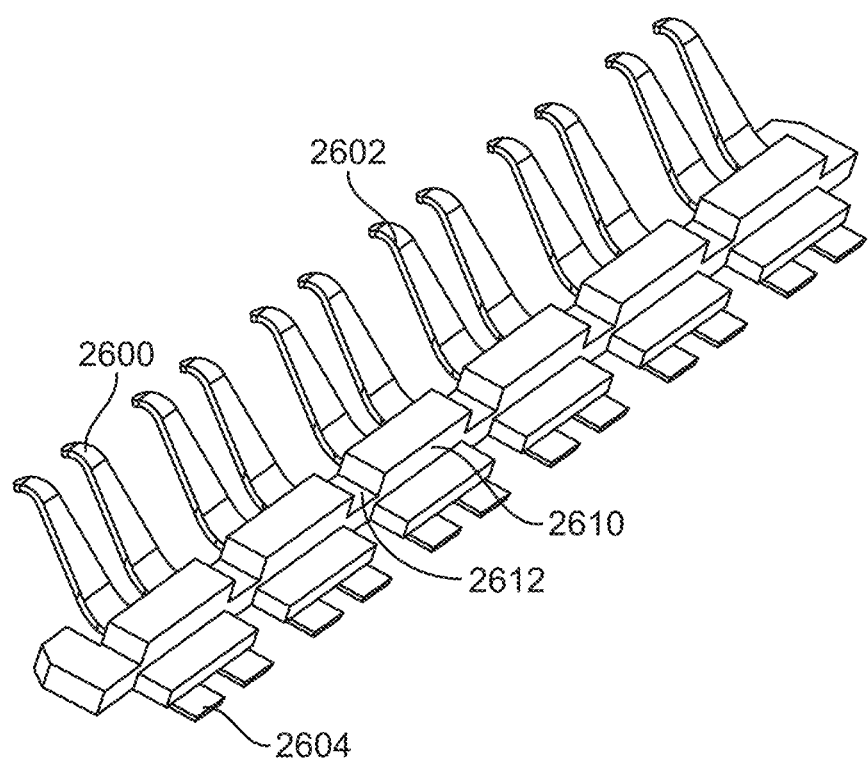
FIGS. 26-28 illustrate another method of manufacturing a connector according to an embodiment of the present invention.
Figure 27:
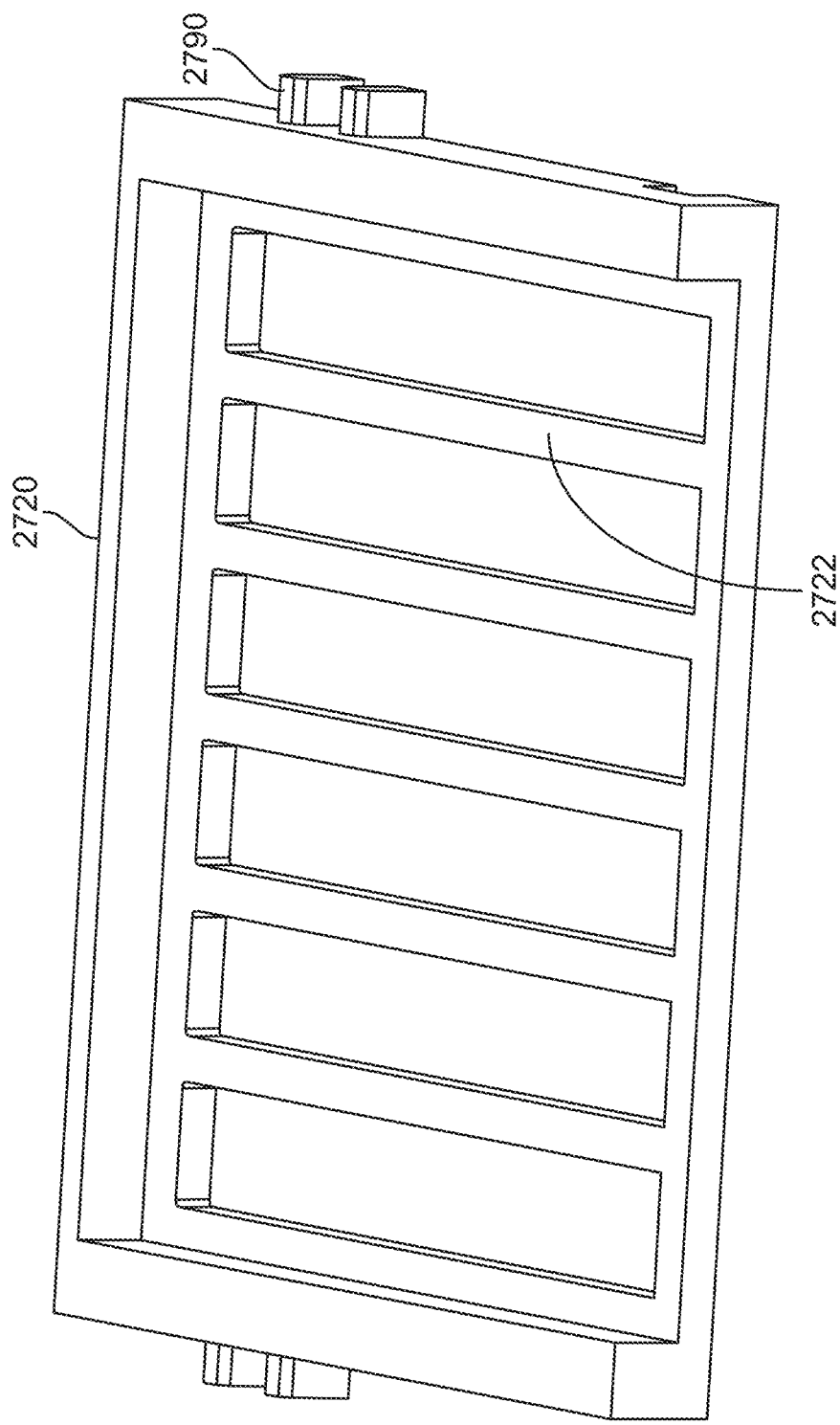
Figure 28:
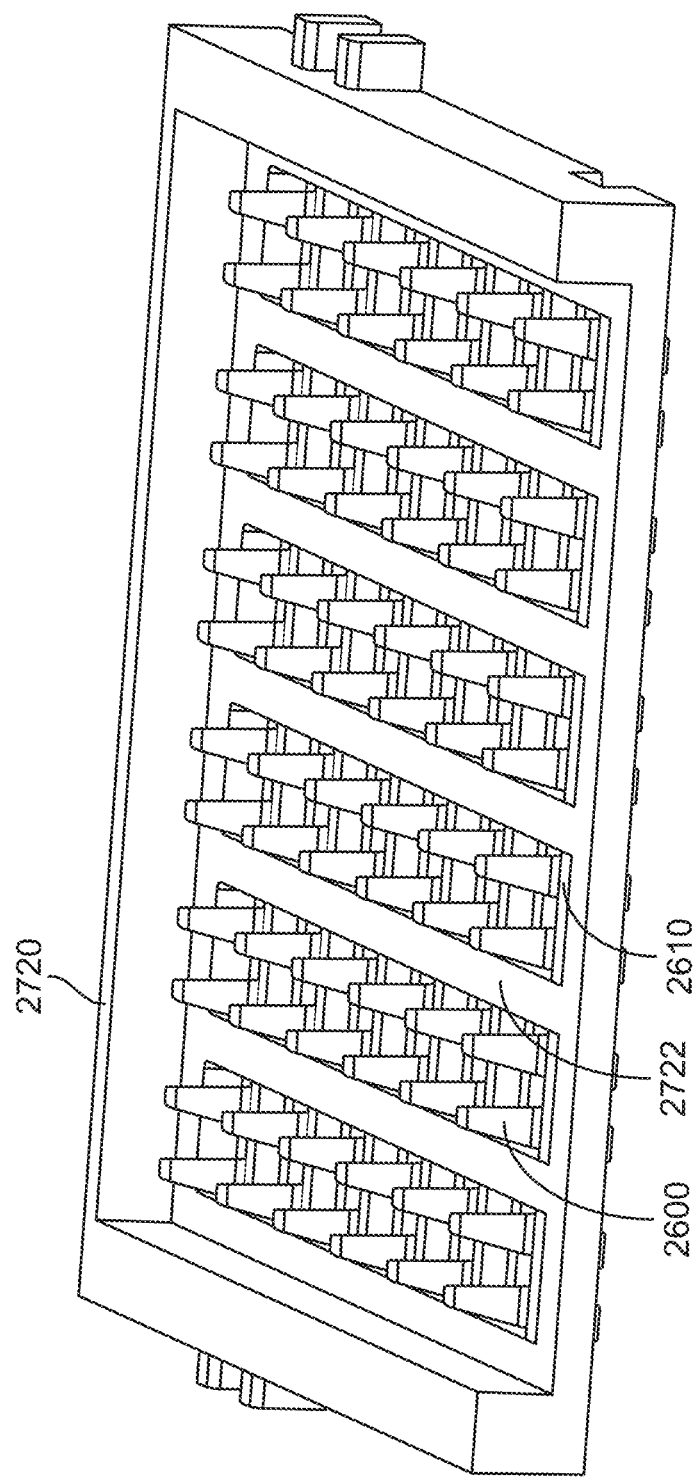

FIGS. 26-28 illustrate another method of manufacturing a connector according to an embodiment of the present invention. In FIG. 26, contacts 2600 can be separated from a carrier (not shown) and the carrier can be recycled. Each contact 2600 can include a contacting portions 2602 for mating with a corresponding contact 1404 on a bottom surface of flexible circuit board 1400, as shown in FIG. 15. Contacts 2600 can also include a surface-mount contacting portions 2604 at an opposite end, though contacts 2600 can instead have through-hole contacting portions (not shown.) Surface-mount contacting portions 2604 can be soldered to a corresponding contact (not shown) on printed circuit board 1500 (shown in FIG. 13) or other appropriate substrate. Contacts 2600 can be supported by array crossbar 2610. Array crossbar 2610 can have notches 2612. In FIG. 27, frame 2720 can be used in the same and similar way as frame 120 of connector 100 (shown in FIG. 1), frame 3200 (shown in FIG. 34), frame 1320 of connector 1300 (shown in FIG. 13), and other frames consistent with embodiments of the present invention. Frame 2720 can include slats 2722. Frame 2720 can also include protrusions 2790, which can be used in the same or similar way as protrusions 900 in FIGS. 11 and 1900 in FIG. 23. In FIG. 28, array crossbars 2610 and contacts 2600 can be fit to slats 2722 in frame 2720. Notches 2612 in array crossbars 2610 can accept slats 2722. In these and other embodiments of the present invention, frame 2720 can be insert or injection molded around array crossbars 2610. These interlocking features can help to secure connector 1300 (shown in FIG. 13) as a single piece.

Figure 29:
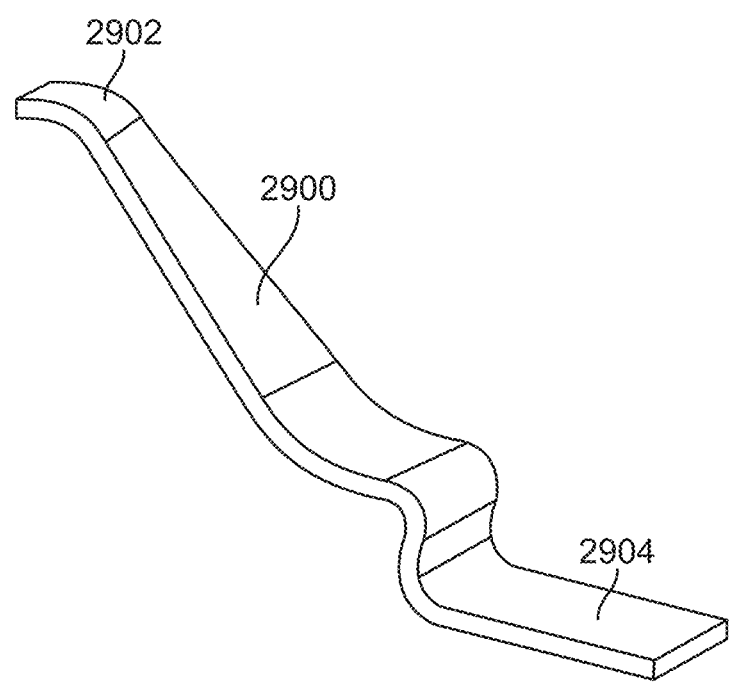
FIGS. 29-32 illustrates a method of manufacturing a connector according to an embodiment of the present invention.
Figure 30:
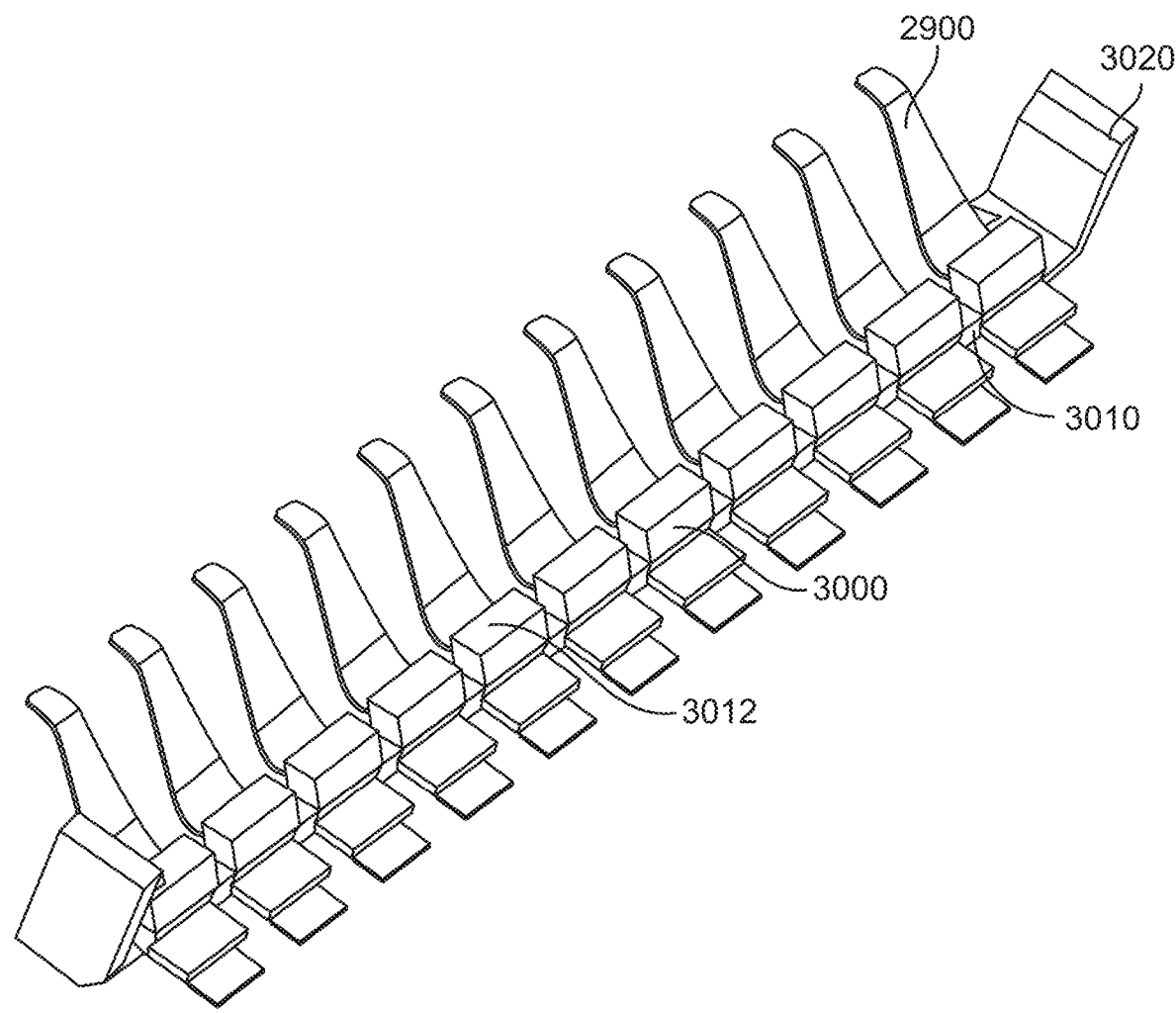

FIGS. 29-32 illustrates a method of manufacturing a connector according to an embodiment of the present invention. In FIG. 29, contact 2900 can be formed. Each contact 2900 can include a contacting portions 2902 for mating with a corresponding contact 1404 on a bottom side of flexible circuit board 1400, as shown in FIG. 15. Contacts 2900 can also include a surface-mount contacting portions 2904 at an opposite end, though contacts 2900 can instead have through-hole contacting portions (not shown.) Surface-mount contacting portions 2904 can be soldered to a corresponding contact (not shown) on a printed circuit board 1500 (shown in FIG. 13) or other appropriate substrate. Contact 2900 can be stamped, forged, 3-D printed, or formed in other ways. In FIG. 30, contacts 2900 can be held in place relative to each other by array crossbar 3000. Array crossbar 3000 can be formed by injection or insert molding or by using other methods or techniques. Array crossbar 3000 can be formed around stamped contacts 2900, or contacts 2900 can be stamped after array crossbar 3000 is formed. Array crossbar 3000 can include notches 3010 and end tabs 3020. Notches 3010 can define thicker portions 3012, which can support contacts 2900.

Figure 31:
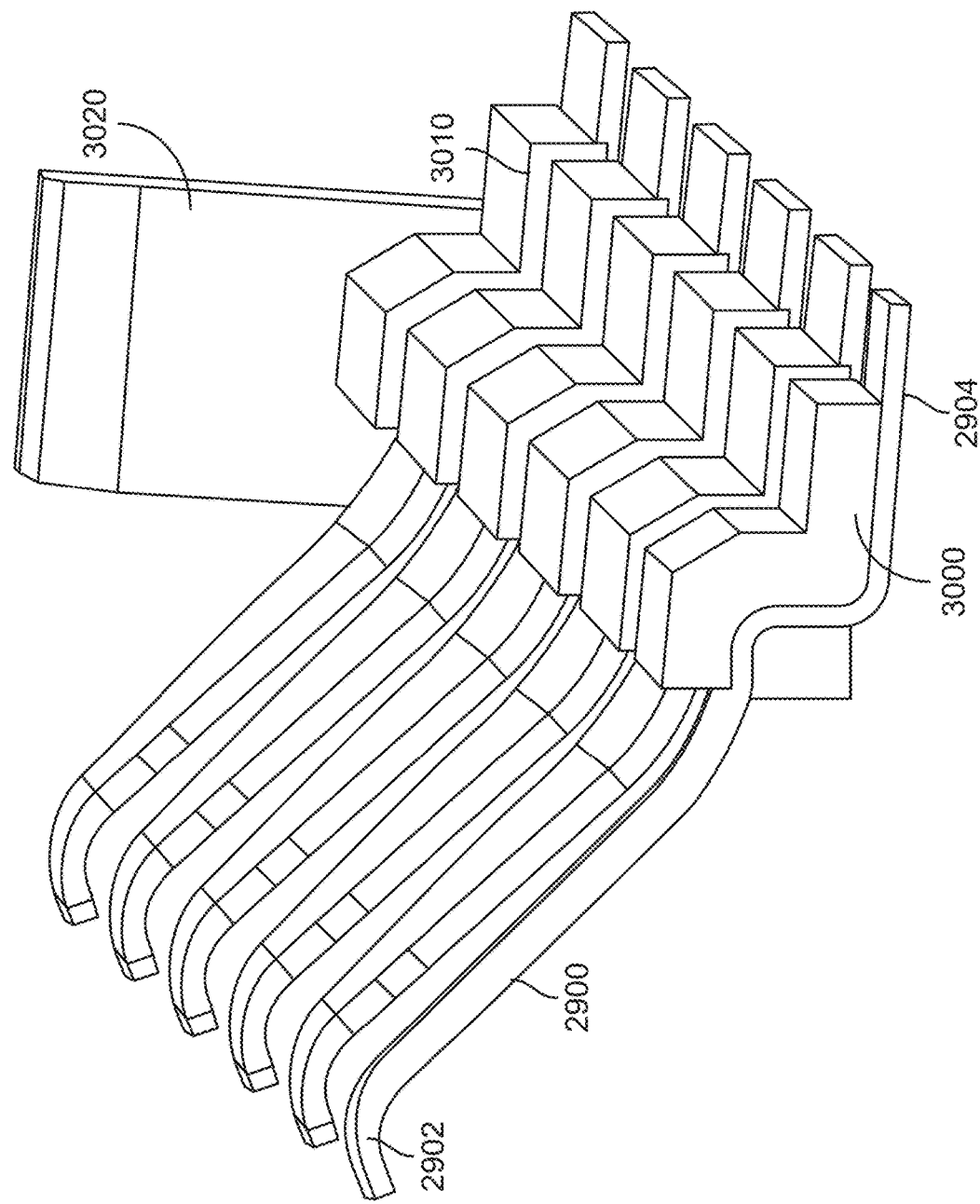

FIG. 31 illustrates a side view of the structure of FIG. 30. Contacts 2900 can be held in place by array crossbar 3000. Contacts 2900 can include contacting portions 2902 and surface-mount contacting portions 2904. Array crossbar 3000 can again include notches 3010 and end tabs 3020.

Figure 32:
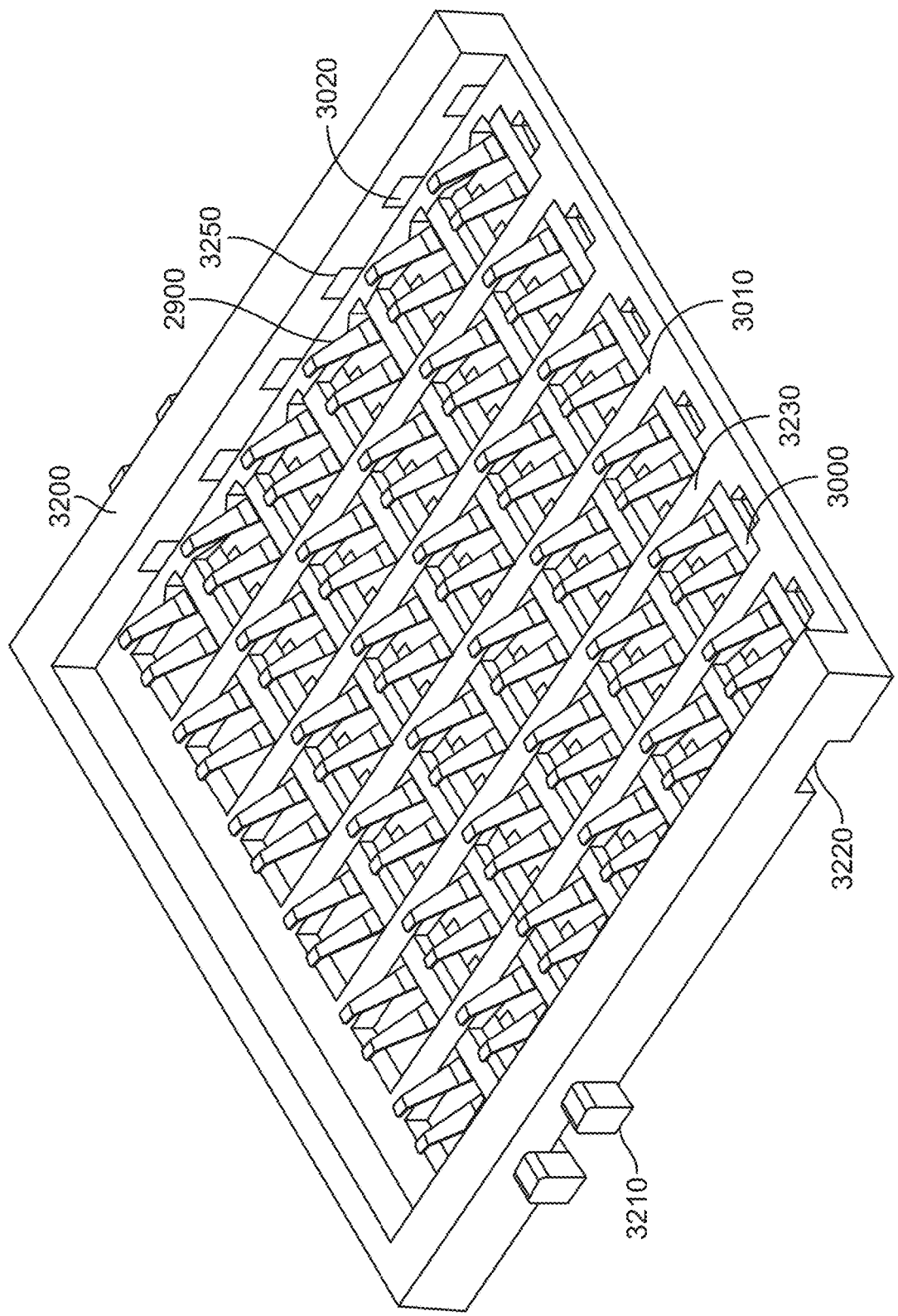
Figure 33:
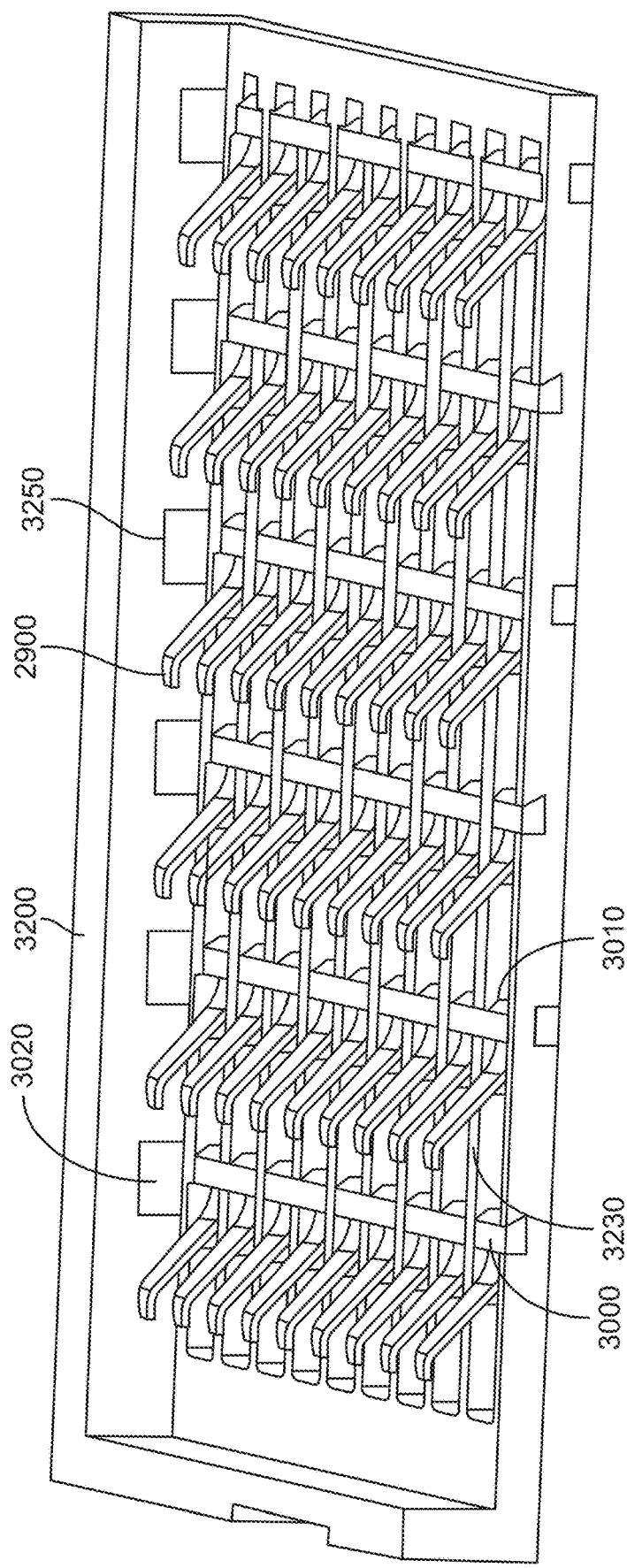
FIG. 33 illustrates a cutaway side view of a connector according to an embodiment of the present invention.

In FIG. 32, frame 3200 can be placed or formed around array crossbars 3000 and contacts 2900. Frame 3200 can be injection or insert molded around array crossbars 3000. Alternatively, frame 3200 can be individually formed as a separate piece and then array crossbars 3000 can be inserted into frame 3200. Frame 3200 can include tabs or protrusions 3210 and notches 3220. Tabs or protrusions 3210 and notches 3220 can be the same or similar as tabs or protrusions 900 and openings 1110 (shown in FIG. 12.) End tabs 3020 of array crossbars 3000 can fit into notches 3250 in sides of frame 3200. This can help to secure array crossbars 3000 in place in frame 3200. Slats 3230 can extend across frame 3200 and can fit in notches 3010 of array crossbars 3000. Slats 3230 can extend between each contact of array crossbar 3000 (as shown in FIG. 33), between each pairs of contacts of array crossbar 3000 (as shown here) between each group of three contacts of array crossbar 3000, or between other numbers of contacts of array crossbar 3000, where the numbers contacts between slats 3230 can be consistent or vary among slats 3230. The interlocking structure of crossbar notches 3010 and slats 3230 can help to improve a rigidity and reduce warpage of the resulting connector during reflow.

FIG. 33 illustrates a cutaway side view of a connector according to an embodiment of the present invention. Rows of contacts 2900 can be held in place by array crossbars 3000. Array crossbars 3000 can include notches 3010 and end tabs 3020. End tabs 2030 can be inserted into notches 3250 in sides of frame 3200 to help secure array crossbars 3000 in place. Slats 3230 can extend between each contact 2900 and can fit in notches 3010 in array crossbars 3000 to improve a rigidity and reduce warpage of the resulting connector during reflow and other heat inducing steps during device assembly. A shell, such as shell 110 or 1310 can be fit over frame 3200. An example is shown in the following figure.

Figure 34:
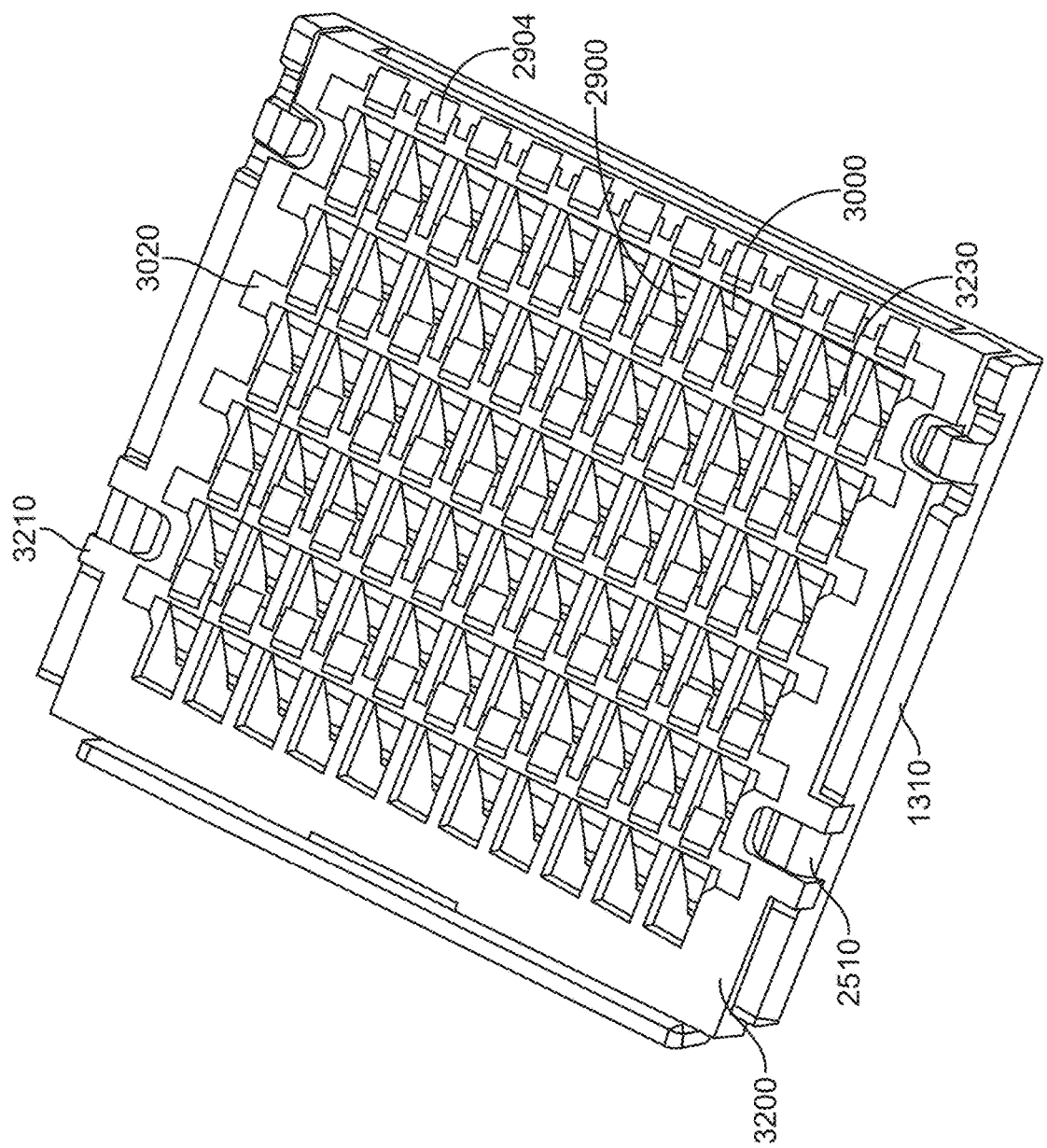
FIG. 34 illustrates an underside view of a connector according to an embodiment of the present invention.

FIG. 34 illustrates an underside view of a connector according to an embodiment of the present invention. In this example, shell 1310 has been fit to frame 3200. Contacts 2900 can be held in place relative to each other by array crossbars 3000. Contacts 2900 can include surface-mount contacting portions 2904. Slats 3230 can extend between each contact 2900 in a row. Along the sides of frame 3200, tabs 2510 of shell 1310 can be bent to fit between tabs or protrusions 3210 of frame 3200. End tabs 3020 can be inserted into frame 3200 to secure array crossbars 3000 in place.

Figure 35:
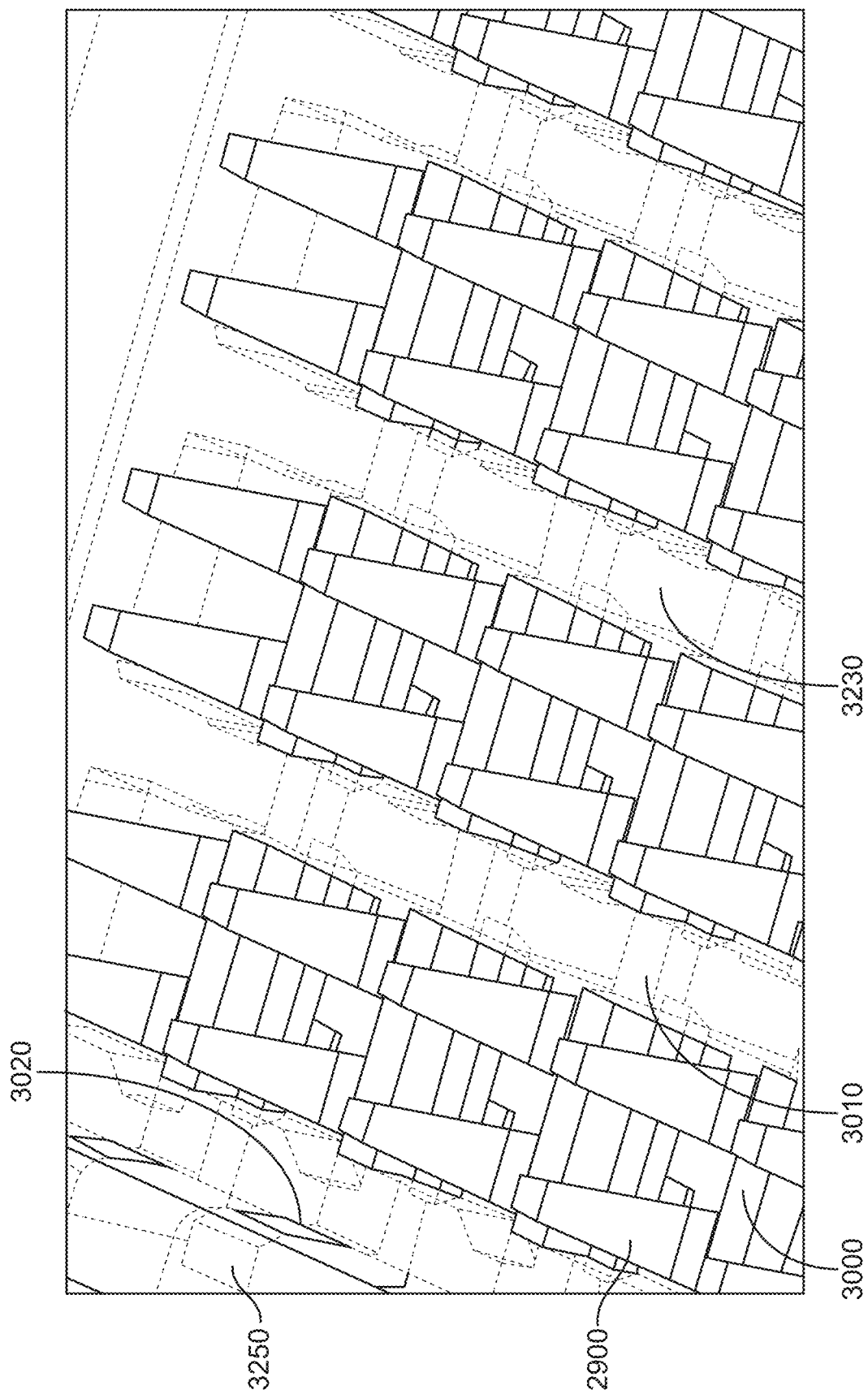
FIG. 35 illustrates a close-up view of a portion of a connector according to an embodiment of the present invention.

FIG. 35 illustrates a close-up view of a portion of a connector according to an embodiment of the present invention. Contacts 2900 can be held in place by array crossbars 3000. Array crossbars 3000 can include notches 3010. Slats 3230 of frame 3200 shown in FIG. 34) can fit in notches 3010 of array crossbars 3000. End tabs 3020 can fit in notches 3250 in sides of frame 3200 to help secure array crossbars 3000 in place.

In this configuration, array crossbars 3000 can be anchored at each end by end tabs 3020 which can be inserted into frame 3200. Slats 3230 can fit in notches 3010 of array crossbars 3000 forming interlocking feature to help secure array crossbars 3000 in place relative to frame 3200.

In these and other embodiments of the present invention, array crossbars 3000 and slats 3230 can interlock with each other in various ways. Again, array crossbars 3000 can be formed. Frame 3200 can be formed as a separate piece and then array crossbars 3000 can be fit in frame 3200. Alternatively, array crossbars 3000 can be formed and placed in position. Frame 3200 can then be molded around array crossbars 3000. In either event, the interlocking features between slats 3230 of frame 3200 and array crossbars 3000 can be slightly melted to further physically connect these structures. Examples of various interconnect features that can be used are shown in the following figures.

Figure 36:
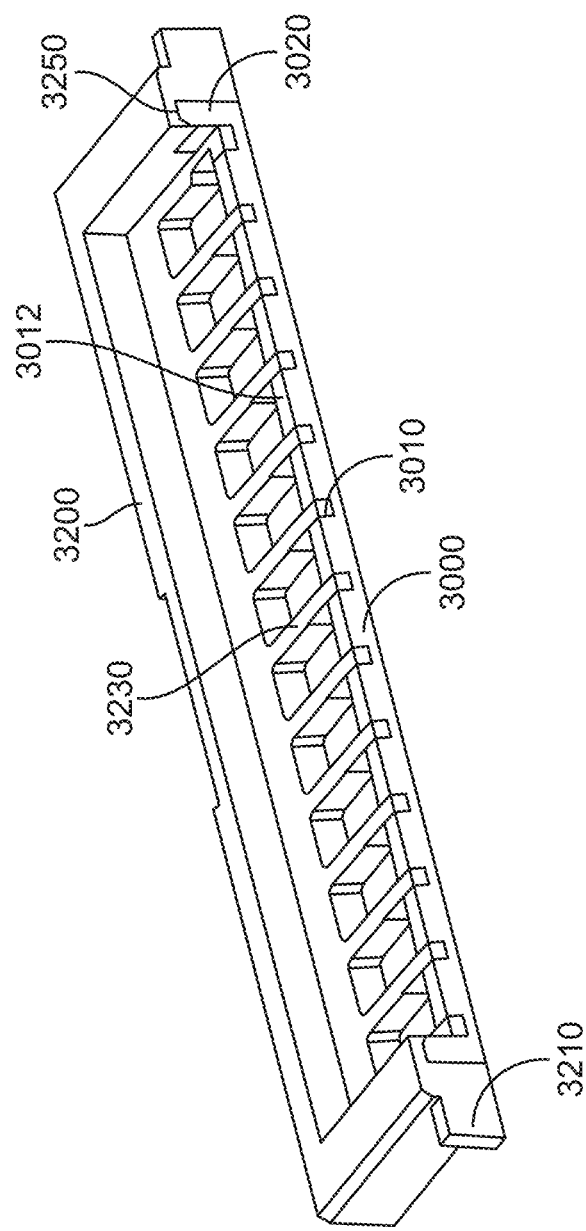
FIG. 36 illustrates a cross-section portion of an array crossbar and a frame according to an embodiment of the present invention.

FIG. 36 illustrates a cross-section portion of an array crossbar and a frame according to an embodiment of the present invention. In this example, slats 3230 of frame 3200 can be located in notches 3010 of array crossbars 3000. Array crossbars 3000 can include thicker portions 3012 for supporting contacts 2900, as shown in FIG. 30. Array crossbars 3000 can include end tabs 3020 which can fit in notches 3250 in frame 3200. Tabs or protrusions 3210 can extend from sides of frame 3200. In this configuration, each slat 3230 can fit in a notch 3010 in a top side of array crossbar 3000. As before, array crossbars 3000 can be arranged and fit to frame 3200. Alternatively, frame 3200 can be injection molded around a number of array crossbars 3000.

Figure 37:
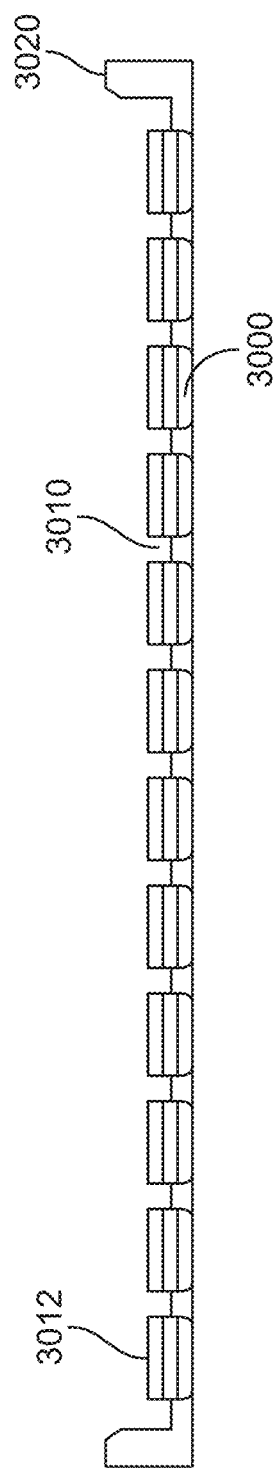
FIG. 37 illustrates an array crossbar according to an embodiment of the present invention.

FIG. 37 illustrates an array crossbar according to an embodiment of the present invention. Array crossbar 3000 can include notches 3010 along a top side. Notches 3010 can define thicker portions 3012. Thicker portions 3012 can support contacts 2900, as shown in FIG. 30. Array crossbar 3000 can further include end tabs 3020, which can fit in notches 3250 in frame 3200, as shown in FIG. 36.

Instead of slats 3230 fitting in notches 3010 in a top side of array crossbar 3000, slats 3230 can instead fit in alternating notches in a top or bottom side of array crossbar 3000. This interlocking feature can help to prevent warpage of a resulting connector during reflow and other manufacturing steps. These interlocking patterns can also improve the strength and durability of the resulting connector, thereby improving its yield and lifetime as well as improving an ability to rework components associated with the connector in a more reliable manner. An example is shown in the following figure.

Figure 38:
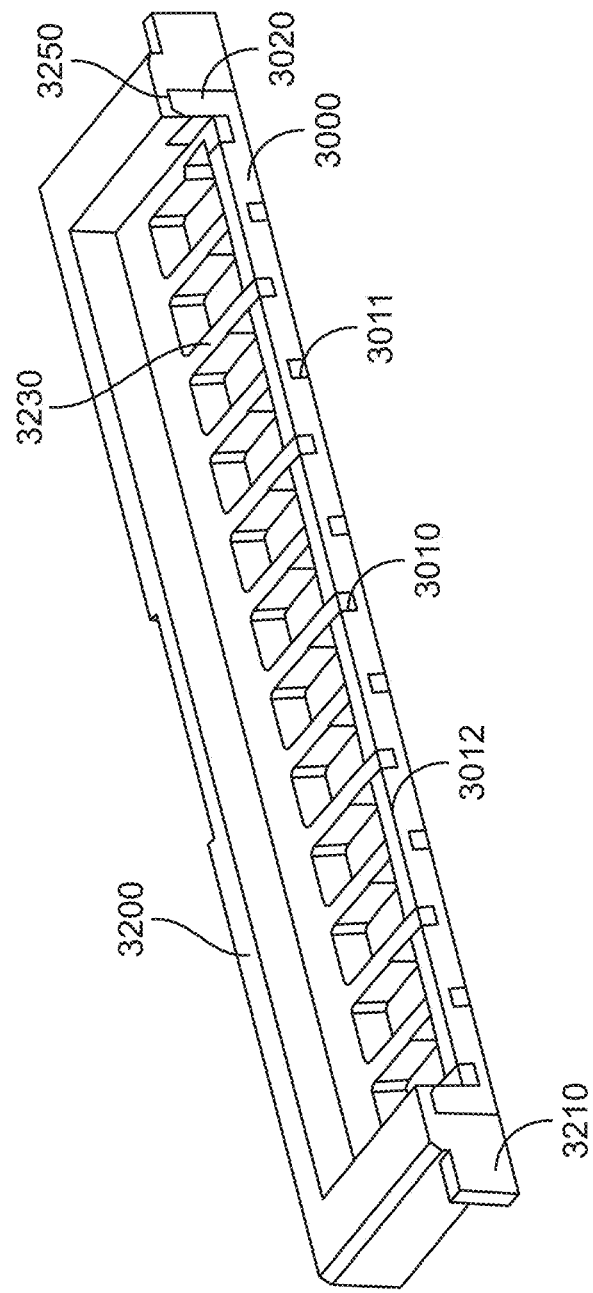
FIG. 38 illustrates a cross-section of an array crossbar and frame according to an embodiment of the present invention.

FIG. 38 illustrates a cross-section of an array crossbar and frame according to an embodiment of the present invention. In this example, slats 3230 of frame 3200 can be located in notches 3010 and notches 3011 in array crossbar 3000. Notches 3010 can be formed in a top side of array crossbar 3000, while notches 3011 can be formed in a bottom side of array crossbar 3000. Notches 3010 and 3011 can define thicker portions 3012, which can support contacts 2900, as shown in FIG. 30. Notches 3010 and 3011 can alternate as shown. In these and other embodiments of the present invention, notches 3010 and 3011 can alternate in other patterns. For example, pairs of notches 3010 can alternate with pairs of notches 3011. Array crossbars 3000 can again include end tabs 3020, which can fit in notch is 3250 in frame 3200. Frame 3200 can further include tabs or protrusions 3210.

Figure 39:
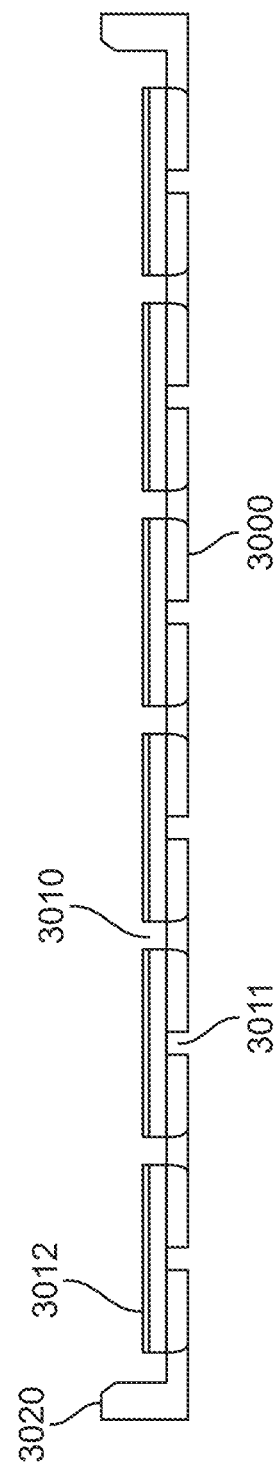
FIG. 39 illustrates an array crossbar according to an embodiment of the present invention.

FIG. 39 illustrates an array crossbar according to an embodiment of the present invention. Array crossbar 3000 can include notches 3010 along a top side, and notches 3011 along a bottom side. Notches 3010 and notches 3011 can defined thicker portions 3012, which can support contacts 2900, as shown in FIG. 30. Array crossbars 3000 can further include end tabs 3020, which can fit in notches 3250 in frame 3200, as shown in FIG. 38.

The above figures illustrate interlocking patterns that can be used to interlock a number of slats with a single array crossbar. These and similar interlocking patterns can further be utilized to interlock a number of array crossbars with a single slat. Examples are shown in the following figures.

Figure 40:
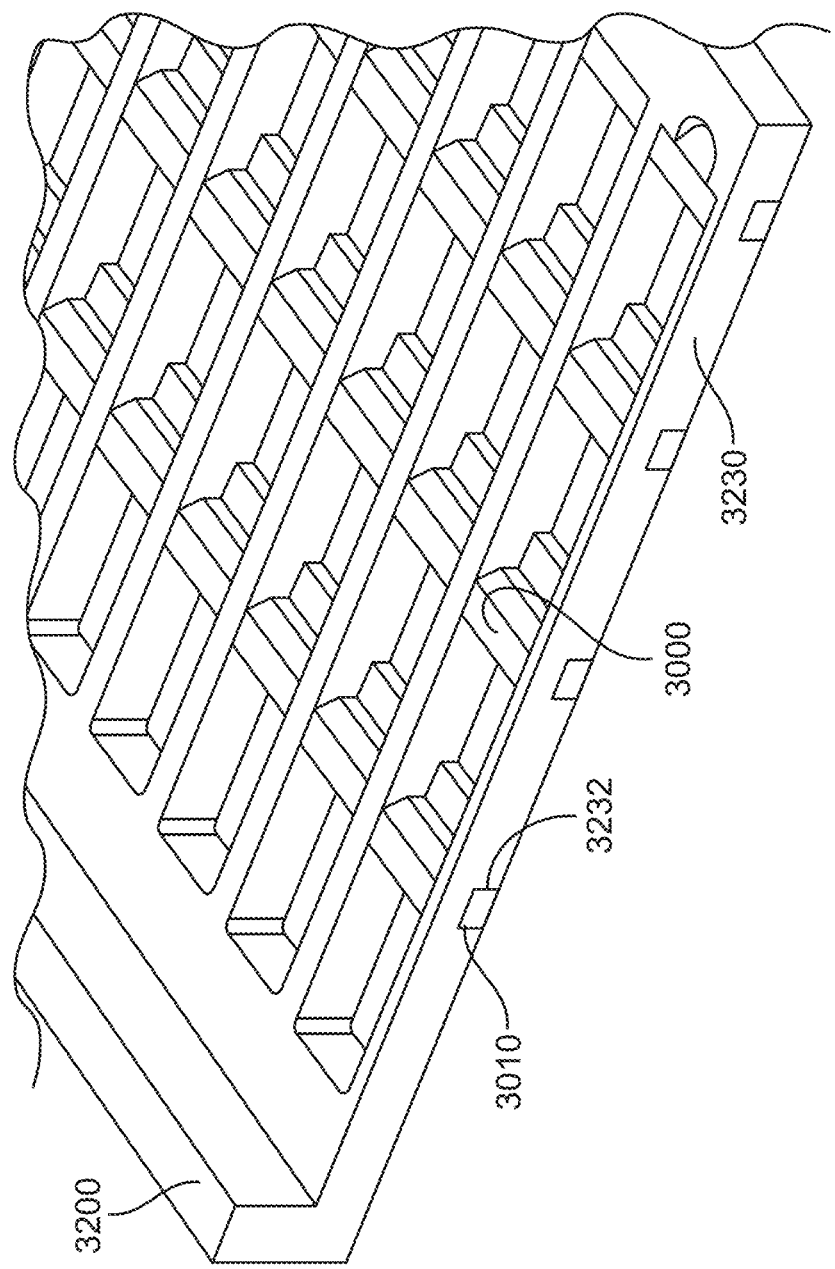
FIG. 40 illustrates a cross-section of a slat in a frame according to an embodiment of the present invention.

FIG. 40 illustrates a cross-section of a slat in a frame according to an embodiment of the present invention. In this example, a number of array crossbars 3000 of frame 3200 can be held together by slats 3230. Slats 3230 can include notches 3232 that can accept notches 3010 of array crossbars 3000. Each of the notches 3232 can be formed in a bottom side of slats 3230. In these and other embodiments of the present invention, other interlocking patterns can be used. An example shown in the following figure.

Figure 41:
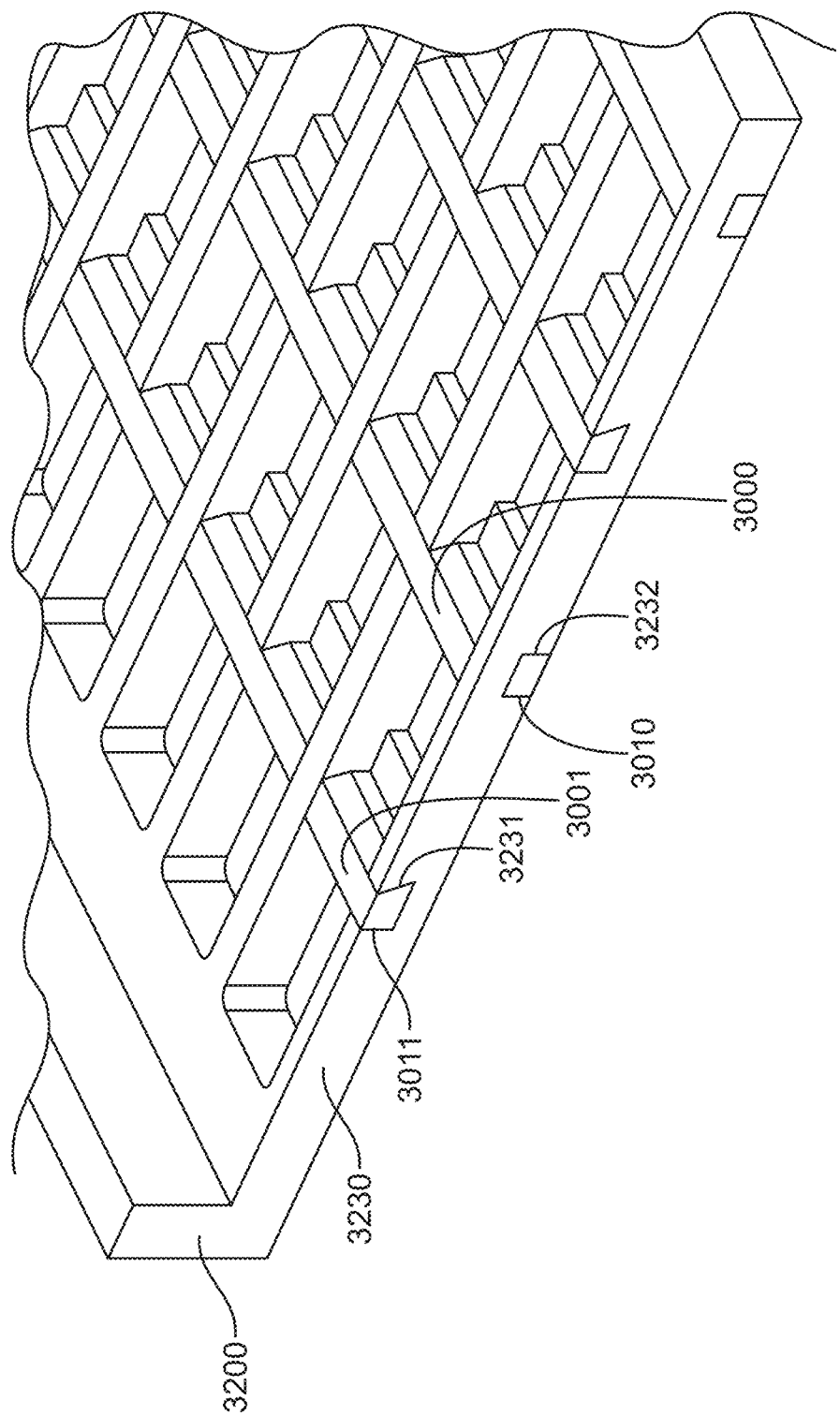
FIG. 41 illustrates a cross-section of a slat in a frame according to an embodiment of the present invention.

FIG. 41 illustrates a cross-section of a slat in a frame according to an embodiment of the present invention. In this example, number of array crossbars 3000 and array crossbars 3001 of frame 3200 can be held together by slats 3230. Slats 3230 can include notches 3232 in a bottom side, and notches 3231 in a top side. Notches 3232 can accept notches 3010 of array crossbars 3000. Array crossbar 3001 can be of similar construction is array crossbar 3000, and can be arranged such that notches 3011 of array crossbar 3001 fit in notches 3231 in a top of slats 3230.

In this configuration, array crossbars 3000 and 3001 can include notches that alternatively fit in notches in a top and bottom side of slat 3230. This interlocking feature can help to prevent warpage of a resulting connector during brief flow and other manufacturing steps. These interlocking patterns can further improve the strength and durability of the resulting connector, thereby improving its yield and lifetime, as well as improving and ability to rework components associated with the connector in a more reliable manner.

In several of the above configurations, such as the configuration shown in FIG. 35, contacts 2900 can be grouped in pairs between slats 3230 in frame 3200. This can be useful when pairs of contacts 2900 convey differential signals. Example pinouts that can take advantage of this and other improvements provided by these connectors are shown in the following figures.

Figure 42:
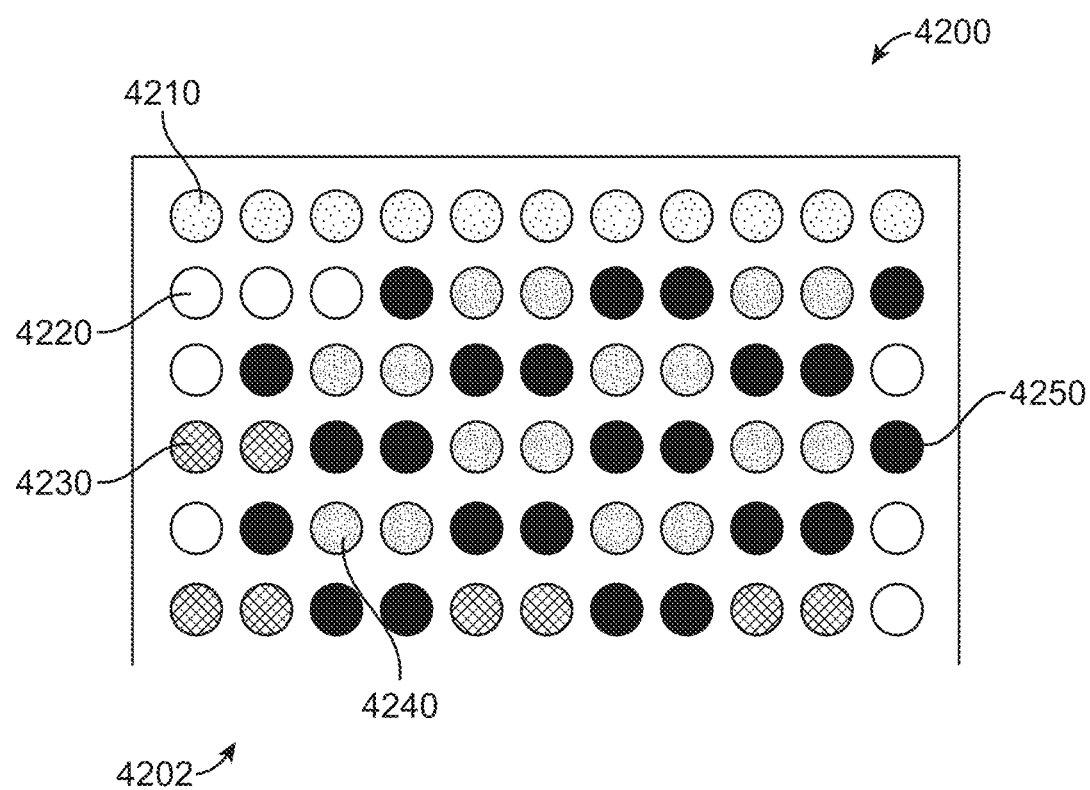
FIG. 42 is a pinout for a contact array of a connector according to an embodiment of the present invention.

FIG. 42 is a pinout for a contact array of a connector according to an embodiment of the present invention. This pinout can be particularly useful for contacts 300 when frame 120 is used in connector 100 (shown in FIG. 1), for contacts 1600 when frame 1320 is used in connector 1300 (shown in FIG. 13), or when contacts 2900 are used in frame 3200 (as shown in FIG. 32.) A flexible circuit board, such as flexible circuit board 200 (shown in FIG. 1) or 1400 (shown in FIG. 13), can be inserted into opening 4202 of connector 4200, which can be the same or similar to connector 100, connector 1300 or a connector using frame 3200 in FIG. 32. In this example, the back row of contacts 4210 can be used as power contacts. This placement ensures that power is not connected between flexible circuit board 200 and connector 100 (shown in FIG. 1) or between flexible circuit board 1400 and connector 1300 (shown in FIG. 13) until the other connections are made as well. High-speed differential signals can be conveyed on contacts 4240. These high-speed differential signals can be shielded by grounds on contacts 4250. Low-speed differential signals can be conveyed on contacts 4230. Other data lines, such as single-ended data lines can be conveyed on contacts 4220.

Figure 43:
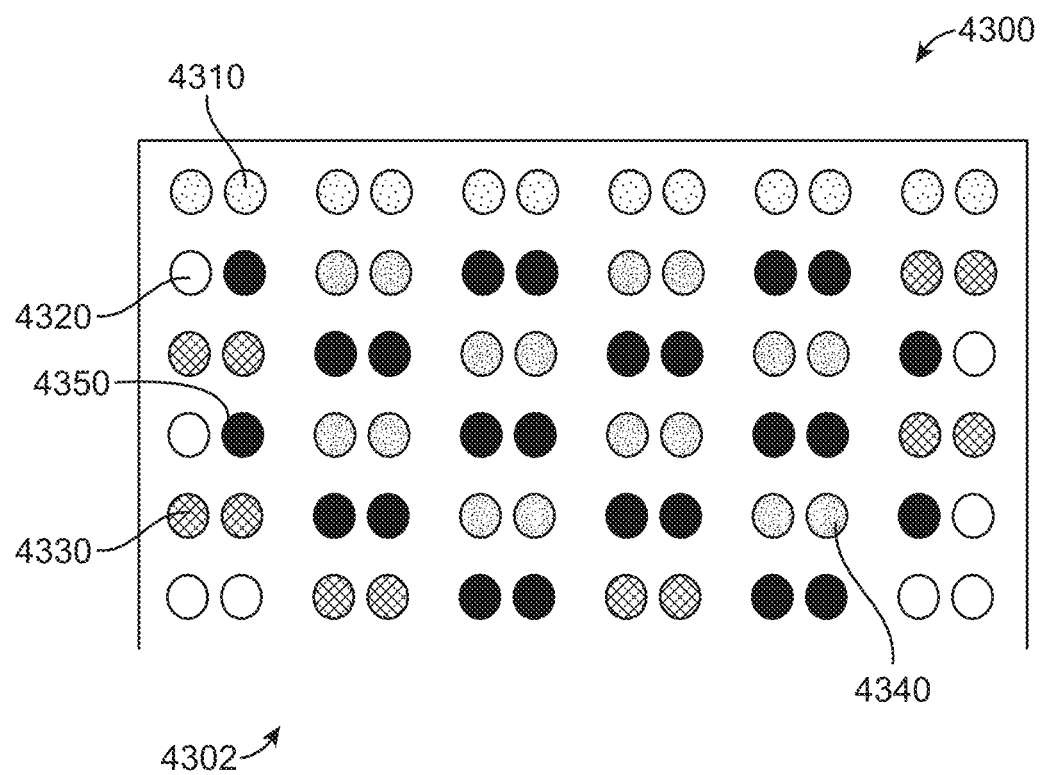
FIG. 43 is another pinout for a contact array of a connector according to an embodiment of the present invention.

FIG. 43 is another pinout for a contact array of a connector according to an embodiment of the present invention. This pinout can be particularly useful for contacts 2600 when frame 2720 is used in connector 100 (shown in FIG. 1), connector 1300 (shown in FIG. 13), or a connector that includes the frame 3200 as shown in FIG. 34. A flexible circuit board, such as flexible circuit board 200 (shown in FIG. 1) or 1400 (shown in FIG. 13), can be inserted into opening 4302 of connector 4300, which can be the same or similar to connector 100 or connector 1300. In this example, the back row of contacts 4310 can be used as power contacts. This placement ensures that power is not connected between flexible circuit board 200 and connector 100 (shown in FIG. 1) or between flexible circuit board 1400 and connector 1300 (shown in FIG. 13) until the other connections are made as well. High-speed differential signals can be conveyed on contacts 4340. These high-speed differential signals can be shielded by grounds on contacts 4350. Low-speed differential signals can be conveyed on contacts 4330. Other data lines, such as single-ended data lines can be conveyed on contacts 4320.

The structures in these and other embodiments of the present invention can be formed of various materials. For example, array crossbar 700, array crossbar 2000, array crossbar 2610, array crossbar 3000 and other portions of frame 120, frame 1320, and frame 2720, frame 3200, and other frames according to embodiments of the present invention can be formed of Liquid Crystal Polymer (LCP), such as SumikaSuper™ E6808, manufactured by Sumitomo Chemical Advanced Technologies of Phoenix, Ariz., Laperos® HA475, manufactured by Polyplastics Co. of Tokyo, Japan, or Vectra® S475, manufactured by Celanese Corp. of Irving, Tex. These portions can also be formed of plastic, nylon, or other nonconductive material. Contacts 300, contacts 1600, and contacts 2600 can be formed of copper, copper alloy, stainless steel, or other conductive material. Stiffener 210 and stiffener 1410 can be formed of copper, copper alloy, stainless steel, or other conductive or nonconductive material. Shell 110 and shell 1310 can be formed of copper, copper alloy, stainless steel, or other conductive or nonconductive material. These various structures can be formed using injection molding, stamping, 3-D printing, forging, drawing, or other manufacturing technique.

Embodiments of the present invention can provide connector systems and connectors that can be located in various types of devices, such as portable computing devices, tablet computers, desktop computers, laptops, all-in-one computers, wearable computing devices, cell phones, smart phones, media phones, storage devices, keyboards, covers, charging cases, portable media players, navigation systems, monitors, power supplies, adapters, audio devices and equipment, remote control devices, chargers, and other devices.

These connector systems and connectors can provide pathways for signals and power compliant with various standards such as one of the Universal Serial Bus (USB) standards including USB Type-C, High-Definition Multimedia Interface® (HDMI), Digital Visual Interface (DVI), Ethernet, DisplayPort, Thunderbolt™, Lightning™, Joint Test Action Group (JTAG), test-access-port (TAP), Directed Automated Random Testing (DART), universal asynchronous receiver/transmitters (UARTs), clock signals, power signals, and other types of standard, non-standard, and proprietary interfaces and combinations thereof that have been developed, are being developed, or will be developed in the future. In one example, the connector systems and connectors can be used to convey a data signal, a power supply, and ground. In various embodiments of the present invention, the data signal can be unidirectional or bidirectional and the power supply can be unidirectional or bidirectional. In these and other embodiments of the present invention, the connector systems and connectors can be used to convey power and ground, while data is transmitted wirelessly The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. A connector comprising:
a contact array, wherein the contact array comprises a plurality of rows, wherein each row comprises:
a plurality of contacts; and
an array crossbar joining the plurality of contacts;
a frame having a plurality of slats, wherein each array crossbar of each of the plurality of rows is fixed to each of the plurality of slats; and a shell over the frame and the contact array, the shell comprising a plurality of tabs folded under the frame and located in corresponding recesses in a bottom of the frame.

2. The connector of claim 1 wherein each array crossbar joins a plurality of contacts such that for each contact, a contacting portion at a first end and a surface-mount contacting portion at a second end are exposed.

3. The connector of claim 2 wherein undersides of the tabs and the surface-mount contacting portion for each contact in the contact array are in the same plane.

4. The connector of claim 2 wherein undersides of the tabs and the surface-mount contacting portion for each contact in the contact array are planarized.

5. The connector of claim 1 further comprising a shell over the frame and the contact array, wherein the shell comprises a plurality of openings to accept a latch formed in a cowling on a flexible circuit board, wherein the openings are arranged along a length of the latch when the flexible circuit board is mated with the connector, wherein the openings are separated by a shell crossbar.

6. The connector of claim 5 wherein the shell crossbar prevents the latch from extending above a top surface of the shell when the flexible circuit board is inserted in the connector.

7. A connector comprising:
an array of contacts, each contact having a surface-mount contacting portion, the array of contacts arranged in a plurality of rows of contacts;
a frame supporting the array of contacts; and
a shell over the frame and the array of contacts and including tabs, wherein the tabs of the shell are folded under the frame and located in corresponding recesses in a bottom of the frame,
wherein each row of contacts comprises a plurality of contacts, and for each row of contacts, the plurality of contacts are joined by a corresponding one of a plurality of array crossbars.

8. The connector of claim 7 wherein undersides of the tabs and the surface-mount contacting portion for each contact in the array of contacts are in the same plane.

9. The connector of claim 7 wherein undersides of the tabs and the surface-mount contacting portion for each contact in the array of contacts are planarized.

10. The connector of claim 9 wherein the frame comprises a plurality of slats, wherein the array crossbar for each of the plurality of rows of contacts are fixed to each of the plurality of slats.

11. The connector of claim 7 wherein the shell further comprises a plurality of openings to accept a latch, the latch formed in a cowling on a flexible circuit board, wherein the openings are arranged along a length of the latch when the flexible circuit board is inserted in the connector, wherein the openings are separated by a shell crossbar.

12. The connector of claim 11 wherein the shell crossbar prevents the latch from extending above a top surface of the shell when the flexible circuit board is inserted in the connector.

13. A connector system comprising:
a flexible circuit board having an end, a cowling over the end, and a latch formed in the cowling; and
a connector comprising:
an array of contacts;
a frame supporting the array of contacts; and
a shell over the frame and the array of contacts, wherein the shell comprises a plurality of holes in a top surface of the shell to accept the latch formed in the cowling on the flexible circuit board, wherein the holes are arranged along a length of the latch when the flexible circuit board is inserted in the connector, wherein the holes are separated by a shell crossbar.

14. The connector system of claim 13 wherein the cowling comprises a plurality of latches.

15. The connector system of claim 13 wherein the shell crossbar prevents the latch from extending above a top surface of the shell.

16. The connector system of claim 15 wherein the latch is stamped in the cowling.

17. The connector system of claim 16 wherein the array of contacts comprises a plurality of rows of contacts, wherein each row of contacts comprises a plurality of contacts joined by a corresponding one of a plurality of array crossbars.

18. The connector system of claim 17 wherein the shell comprises a plurality of tabs folded under the frame and located in corresponding recesses in a bottom of the frame.

19. The connector of claim 7 wherein each array crossbar joins a plurality of contacts such that for each contact, a contacting portion at a first end and a surface-mount contacting portion at a second end are exposed.

20. The connector of claim 18 wherein each array crossbar joins a plurality of contacts such that for each contact, a contacting portion at a first end and a surface-mount contacting portion at a second end are exposed.

* * * * *